United States Patent
Noori

(10) Patent No.: US 10,938,348 B1
(45) Date of Patent: Mar. 2, 2021

(54) COMPLETE TURN OFF AND PROTECTION OF BRANCHED CASCODE AMPLIFIER

(71) Applicant: pSemi Corporation, San Diego, CA (US)

(72) Inventor: Hossein Noori, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 16/669,371

(22) Filed: Oct. 30, 2019

(51) Int. Cl.
*H03F 1/02* (2006.01)
*H03F 3/19* (2006.01)
*H04B 1/16* (2006.01)

(52) U.S. Cl.
CPC .............. *H03F 1/0205* (2013.01); *H03F 3/19* (2013.01); *H03F 2200/294* (2013.01); *H03F 2200/451* (2013.01); *H04B 1/16* (2013.01)

(58) Field of Classification Search
CPC ........................................................ H03F 1/02
See application file for complete search history.

(56) References Cited

U.S. PATENT DOCUMENTS

| | | | |
|---|---|---|---|
| 5,764,097 A * | 6/1998 | Whitfield ................... | G05F 3/24 327/504 |
| 9,929,701 B1 | 3/2018 | Noori et al. | |
| 2006/0071703 A1 * | 4/2006 | Chatterjee ................ | G05F 3/242 327/534 |
| 2010/0231193 A1 * | 9/2010 | Nascimento ...... | H03K 17/08142 323/315 |
| 2010/0237945 A1 * | 9/2010 | Cassia ..................... | H03F 1/523 330/277 |
| 2014/0184328 A1 * | 7/2014 | Binet ..................... | H03F 3/2173 330/251 |
| 2019/0372532 A1 * | 12/2019 | Kuwata ................... | H03F 1/523 |
| 2020/0162031 A1 * | 5/2020 | Lin ........................... | H03F 3/19 |

* cited by examiner

*Primary Examiner* — Patricia T Nguyen
(74) *Attorney, Agent, or Firm* — Steinfl + Bruno LLP

(57) ABSTRACT

Various methods and circuital arrangements for complete turn OFF of branches of a multi-branch cascode amplifier are presented. According to one aspect, a protection circuit coupled to a source node of an output transistor of a branch couples a reference voltage to the source node of the output transistor when the branch is turned OFF, and decouples the reference voltage from the source node when the branch is turned ON. According to another aspect, the protection circuit includes a switch whose off capacitance is sufficiently low so as not to affect performance of the branch when the branch is ON, and whose on resistance is sufficiently low to sufficiently reduce an RF amplitude at the source node of the output transistor when the branch is OFF and other branches are ON, and therefore allow use of low-voltage thin-oxide transistors in the branch. Further aspects include a second switch and use of transistor switches.

24 Claims, 15 Drawing Sheets

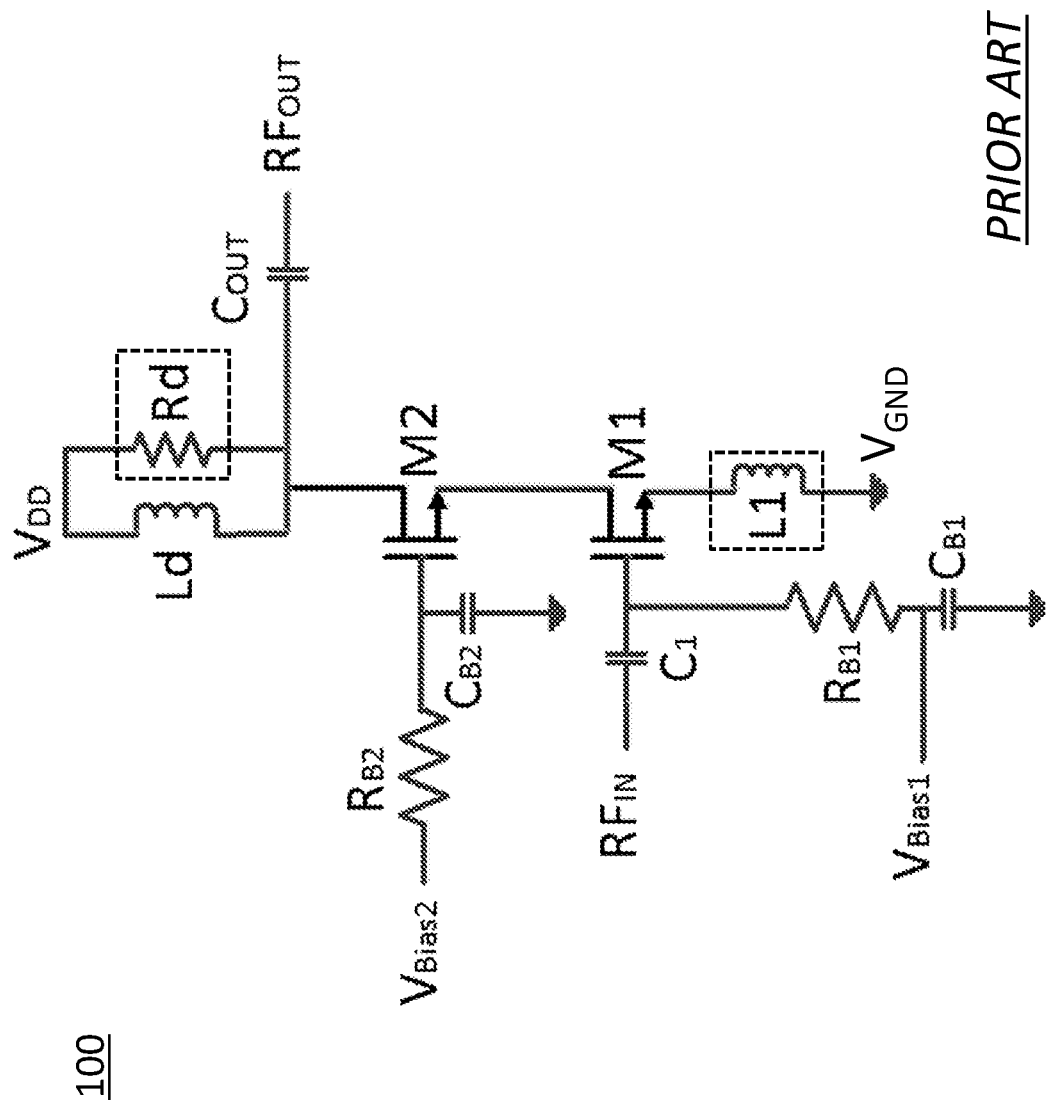
FIG. 1 *PRIOR ART*

COMPLETE TURN OFF AND PROTECTION OF BRANCHED CASCODE AMPLIFIER

CROSS REFERENCE TO RELATED APPLICATIONS

The present application is related to U.S. Pat. No. 9,929,701 B1 entitled "LNA with Programmable Linearity" issued Mar. 27, 2018, the disclosure of which is incorporated herein by reference in its entirety.

TECHNICAL FIELD

The present application relates to amplifiers. In particular, the present application relates to turn off and protection of multi-branch amplifiers comprising multiple branches of stacked transistors.

BACKGROUND

In recent years, stacked cascode amplifiers, which use a plurality of transistors arranged as a stack (stacked transistors), have become predominant in radio frequency (RF) applications, such as, for example, power amplifiers (PAs) in transmitter sections of RF front-end modules, or as low-noise amplifiers (LNAs) in receiver sections of RF front-end modules. Due to the higher number of transistors in the stack, voltage handling capability of the amplifier is increased, thereby allowing the higher power, higher voltage outputs. Since the stacked transistors comprise individual low-voltage transistors, which can tolerate a voltage substantially lower than the output voltage of the amplifier, it is important to bias the low-voltage transistors of the stack such that they maintain operation within their tolerable voltage ranges. In cases where the amplifier can operate in different modes of operation, such as, for example, an active (amplification, ON, activated) mode and an inactive (no amplification, OFF, deactivated) mode, such voltage compliance of the low-voltage transistors of the stack must be maintained during each of the modes of operation.

FIG. 1 shows a prior art configuration of a stacked cascode amplifier (100) comprising an input transistor M1 for receiving an input RF signal, $RF_{IN}$, in series connection with a cascode output transistor M2 for outputting an amplified version, $RF_{OUT}$, of the input RF signal. DC blocking capacitor $C_1$ is used to block DC biasing voltage provided to the input transistor M1 from the $RF_{IN}$ signal, while capacitor $C_{OUT}$ is used for both output matching and blocking supply voltage $V_{DD}$ from the $RF_{OUT}$ port. A supply voltage $V_{DD}$ is coupled to the drain of the output transistor M2 through an inductor Ld, and a reference ground $V_{GND}$ (e.g., GND or AC ground) is coupled to the source of the input transistor M1 through an optional inductor L1 (e.g., degeneration inductor). An optional resistor, Rd, in parallel with the inductor Ld can be used to control the amount of amplification of the input RF signal, $RF_{IN}$ and/or the Q and thus impact the bandwidth of the output match. It should be noted that a number n of the stacked transistors may be any integer number greater than or equal to two, and may be a function of a level of the supply voltage, tolerable voltage (e.g., handling voltage) ranges of the transistors (M1, M2, . . . , Mn), and the AC voltage swing at the drain terminal of transistor Mn.

In the prior art amplifier (100) of FIG. 1, biasing of the transistors M1 and M2 may be provided via respective biasing voltages $V_{Bias1}$ and $V_{Bias2}$ coupled to gates of the transistors via respective series resistors $R_{B1}$ and $R_{B2}$. A shunting gate capacitor, $C_{B2}$, coupled to the gate of the cascode transistor M2 is configured to short the gate of M2 at frequencies of operation (e.g., frequencies of the RF signal) of the amplifier (100) in order to provide a common-gate configuration of the cascode transistor M2. In some cases such as in power amplifiers, the capacitor on the gate of the common gate devices may be a smaller value as to provide a capacitive impedance to the gate. On the other hand, at the frequencies of operation of the amplifier (100), the source of input transistor M1 is coupled to the reference ground either directly (no optional inductor L1) or through the optional inductor L1, so as to provide a common-source configuration of the input transistor. In general, the stacked cascode amplifiers described in the present disclosure include a common-source input transistor and one or more common-gate cascode transistors.

The prior art amplifier (100) of FIG. 1 may operate according to at least two modes of operation, an active mode wherein both M1 and M2 are biased ON (i.e., turned ON) and the input RF signal is amplified by converting it to an RF current that flows through Ld and generates AC voltage swing at the drain terminal of transistor M2, and an inactive mode wherein both transistors are turned OFF, and therefore no amplification occurs. Control of the amplifier (100) for operation according to the active mode or the inactive mode may be provided via the biasing voltages, $V_{Bias1}$ and $V_{Bias2}$. For example, by setting $V_{Bias1}$ and $V_{Bias2}$ to voltage values such that the gate-to-source and the drain-to-source voltages of the input transistor M1 are, respectively, greater than a threshold voltage, Vth, and a saturation voltage, $V_{sat}$ of the input transistor M1, the input RF signal, $RF_{IN}$, is converted to current by transistor M1 and conducted to Ld to generate voltage swing at the drain terminal of transistor M2. On the other hand, by setting $V_{Bias1}$ and $V_{Bias2}$ such that the gate-to-source voltage of the input transistor M1 are, respectively, smaller than a threshold voltage, Vth, of the input transistor M1, no current flows through the amplifier (100) and therefore no amplification is provided. A person skilled in the art is well aware of implementation designs of biasing circuits for generating the biasing voltages $V_{Bias1}$ and $V_{Bias2}$ for operation according to the two modes while considering, for example, amplifier (100) performance during the active mode, power consumption during the inactive mode, voltage compliance of the transistors during both the active mode and the inactive mode, and current-voltage characteristics of the transistors of the stack as provided, for example, by their respective I-V curves. For example, it is also possible to place the amplifier in the inactive mode by setting $V_{Bias2}$ to a low voltage such as 0 V.

During the active mode of operation of the prior art amplifier (100) of FIG. 1, the drain of the output transistor M2 carries a voltage combination of a) a DC component that can be up to a level of the supply voltage $V_{DD}$, and b) an AC component, $V_O$, whose peak voltage depends on the impedance of Ld, $C_{OUT}$, and the port impedance at $RF_{OUT}$ at the frequency of operation. Accordingly, a drain-to-gate voltage, $V_{DG\_M2}$, of the common-gate cascode transistor M2 can be provided by the expression: $V_{DG\_M2}=(V_{DD}-V_{Bias2})+V_O$. Because $V_{Bias2}$ is typically close to $V_{DD}$, there is no substantial DC component during the active mode of operation and therefore $V_{DG\_m2}$ is dominated by the AC component, $V_O$. On the other hand, during the inactive mode of operation, there is no AC component at the drain of the output transistor M2, and therefore the drain of the output transistor M2 only carries the DC component that can be up to the level of the supply voltage $V_{DD}$. Accordingly, during the inactive mode of operation, the drain-to-gate voltage, $V_{DG\_M2}$, of the common-gate cascode transistor M2 can be provided by the expression: $V_{DG\_M2}=(V_{DD}-V_{Bias2})$, which in the (extreme) case where $V_{Bias2}=0$ volts, becomes $V_{DG\_m2}=V_{DD}$. Since the (peak value of the) voltage $V_0$ is typically lower than the level of the supply voltage $V_{DD}$, by selecting a type of the output transistor M2 to withstand the level of the supply voltage $V_{DD}$ across its drain and gate terminals, safe operation of the output transistor M2 during both modes of operation can be obtained. In an exemplary case where the level of the supply voltage $V_{DD}$ is about 1.2 volts, a thin-oxide transistor that can withstand voltage levels of up to 1.32 volts across any two terminals of the transistor can be used as the input transistor M1 and as the output transistors M2 for improved performance (e.g., linearity, gain, noise figure) of the amplifier (100). A person skilled in the art is well aware of differences in performance provided by a thin-oxide transistor as compared to a thick-oxide transistor for a given fabrication process, including a better RF performance (e.g., linearity, gain, noise figure) for the thin-oxide transistor and a higher voltage tolerance for the thick-oxide transistor.

FIG. 2A shows a prior art configuration of a branched (multi-branch) cascode amplifier (200A) comprising a plurality (e.g., two) of branches, (M11, M12) and (M21, M22), each branch comprising a stacked cascode amplifier similar to the amplifier (100) of FIG. 1. As can be seen in FIG. 2A, DC blocking capacitors $C_1$ and $C_2$ respectively couple the input RF signal, $RF_{IN}$, to a respective input transistor M11 and M21 of each of the branches, (M11, M12) and (M21, M22), and a matching (and DC blocking) capacitor, $C_{OUT}$, matches the impedance seen at the drain nodes of the cascode output transistors M12 and M22 of the respective branches to the impedance seen at the $RF_{OUT}$ port, and couples the AC voltage swing, $V_0$, at common drain nodes of the cascode output transistors M12 and M22 of the respective branches to the output port. $C_{OUT}$ also blocks the supply voltage, $V_{DD}$, from the output port. Switching arrangements ($SW_{11}$, $SW_{12}$) and ($SW_{21}$, $SW_{22}$) coupled to respective input transistors M11 and M21 allow individual control of the branches for operation according to an active state (branch amplifies, branch is ON, ON state) and an inactive state (branch does not amplify, branch is OFF, OFF state). For example, to enable amplification through the branch (M21, M22), the switch $SW_{22}$ can be in the open position so as to decouple the gate of the input transistor M21 from the reference ground, $V_{GND}$, and the switch $SW_{21}$ can be in the closed position so as to couple the gate of the input transistor M21 to the biasing voltage $V_{Bias1}$. On the other hand, to disable amplification through the branch (M21, M22), the switch $SW_{22}$ can be in the closed position so as to couple the gate of the input transistor M21 to the reference ground, $V_{GND}$, and the switch $SW_{21}$ can be in the open position so as to decouple the gate of the input transistor M21 from the biasing voltage $V_{Bias1}$. A person skilled in the art understands that by activating (turning ON, ON state, enabling) or deactivating (turning OFF, OFF state, disabling) one or more branches, more or less current can flow (from supply voltage $V_{DD}$ to reference ground $V_{GND}$) though the amplifier (200A), and therefore more or less gain can be provided by the amplifier. Furthermore, as clearly understood by a person skilled in the art, current through each branch can be different and based on a size of transistors of the branch. Finally, a person skilled in the art would understand that an active mode of the amplifier (200A) can include at least one activated branch (ON state of the branch) and an inactive mode of the amplifier (200A) can include all branches being deactivated. More description of the branched cascode amplifier (200A) can be found, for example, in the above referenced U.S. Pat. No. 9,929,701 B1.

In contrast to the prior art (single branch) configuration of FIG. 1, in the prior art (multi-branch) configuration shown in FIG. 2A, a drain node of an output cascode transistor (e.g., M22) of a deactivated (i.e., turned OFF, inactive) branch may still see an AC component corresponding to an amplified RF signal through an active branch. Accordingly, using the previously described expression of the drain-to-gate voltage to the branch (M21, M22), one gets: $V_{DG\_M22}=(V_{DD}-V_{Bias22})+V_0$, and if $V_{Bias22}=0$ Volts (e.g., gate coupled to $V_{GND}$) in the deactivated state of the branch (M21, M22), then $V_{DG\_M22}=V_{DD}+V_0$, which may represent a voltage level higher than a voltage tolerable by the transistor M22. One solution for overcoming such problem of potentially subjecting the transistor M22 to higher voltage levels may be to use a thick-oxide transistor with an inherently higher maximum tolerable voltage as the transistor M22 (or any other output transistor, e.g., M12). However, as described above, such thick-oxide transistor may degrade performance of the amplifier (200A), especially at lower supply voltage, $V_{DD}$.

Another possible solution to the above problem may be to not set $V_{Bias22}=0$ Volts, so that the output transistor M22 is protected from the higher voltage levels. For example, a biasing voltage (e.g., $V_{Bias22}$) provided to the gate of the output cascode transistor M22 when the branch (M21, M22) is OFF can be (substantially) equal to a biasing voltage provided to the gate of M22 when the branch is ON. Accordingly, in the OFF state of the branch, $V_{DG\_M22}=(V_{DD}-V_{Bias2})+V_0$, and therefore for an exemplary case of a supply voltage of about 1.2 volts, a (higher performance) thin-oxide transistor that can tolerate about 1.32 volts can be used as the output cascode transistor M22. However, while the input transistor (e.g., M21) of a turned OFF branch is turned OFF (e.g., gate is biased at 0 Volts), since the gate of the output transistor M22 is still biased at $V_{Bias2}$, it will leak current, as the gate-to-source voltage of this transistor will not be less than or equal to 0 Volts, and consequently degrade the performance of the amplifier (200A) as provided by other active branches. For example, relatively large RF voltage amplitudes seen at the drain of an output transistor (e.g., M22) of a turned OFF branch (e.g., M21, M22) may partially turn ON and modulate the output resistance of such output transistor during the negative swing of the RF voltage, which in turn will negatively affect the RF performance such as linearity, gain, and noise figure. Teachings according to the present disclosure provide a solution to degradation in performance of a branched cascode amplifier due to turned OFF branches while protecting transistors of the branches from voltage levels above tolerable voltage ranges of the transistors.

SUMMARY

According to a first aspect of the present disclosure, a multi-branch cascode amplifier is presented, the multi-branch cascode amplifier comprising: a plurality of stacked cascode amplifier branches, each branch comprising a common-source input transistor and one or more common-gate cascode transistors comprising an output transistor whose drain, that is coupled to a supply voltage, is a common output node of the multi-branch cascode amplifier, the each branch configured to operate according to an ON state for amplification at the common output node of an input RF signal coupled to the input transistor of the branch, and an OFF state for no amplification of the input RF signal; and a protection circuit coupled to a source node of the output transistor of a first branch of the plurality of stacked cascode amplifier branches, wherein: during the OFF state of the first branch and the ON state of one or more other branches of the plurality of stacked cascode amplifier branches, the protection circuit is configured to selectively couple a reference voltage to the source node of the output transistor of the first branch.

According to a second aspect of the present disclosure, a method for turning OFF a branch of a multi-branch cascode amplifier is presented, the method comprising: turning ON a plurality of branches of the multi-branch cascode amplifier by: providing to each branch of the plurality of branches respective gate biasing voltages to a common-source input transistor and one or more common-gate cascode transistors of the branch for operation of the branch as an amplifier during a respective ON state of the branch; and turning OFF one branch of the plurality of branches by: setting the biasing voltage of the common-source input transistor to the reference ground, $V_{GND}$, and coupling a reference voltage to a source node of an output transistor of the branch so that a gate-to-source voltage of said output transistor is less than 0 Volts, and maintaining a same biasing voltage of the respective gate biasing voltages to a gate of the output transistor of said branch during the ON state and the OFF state of the branch.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1 shows a prior art configuration of a stacked transistor amplifier.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 2A:
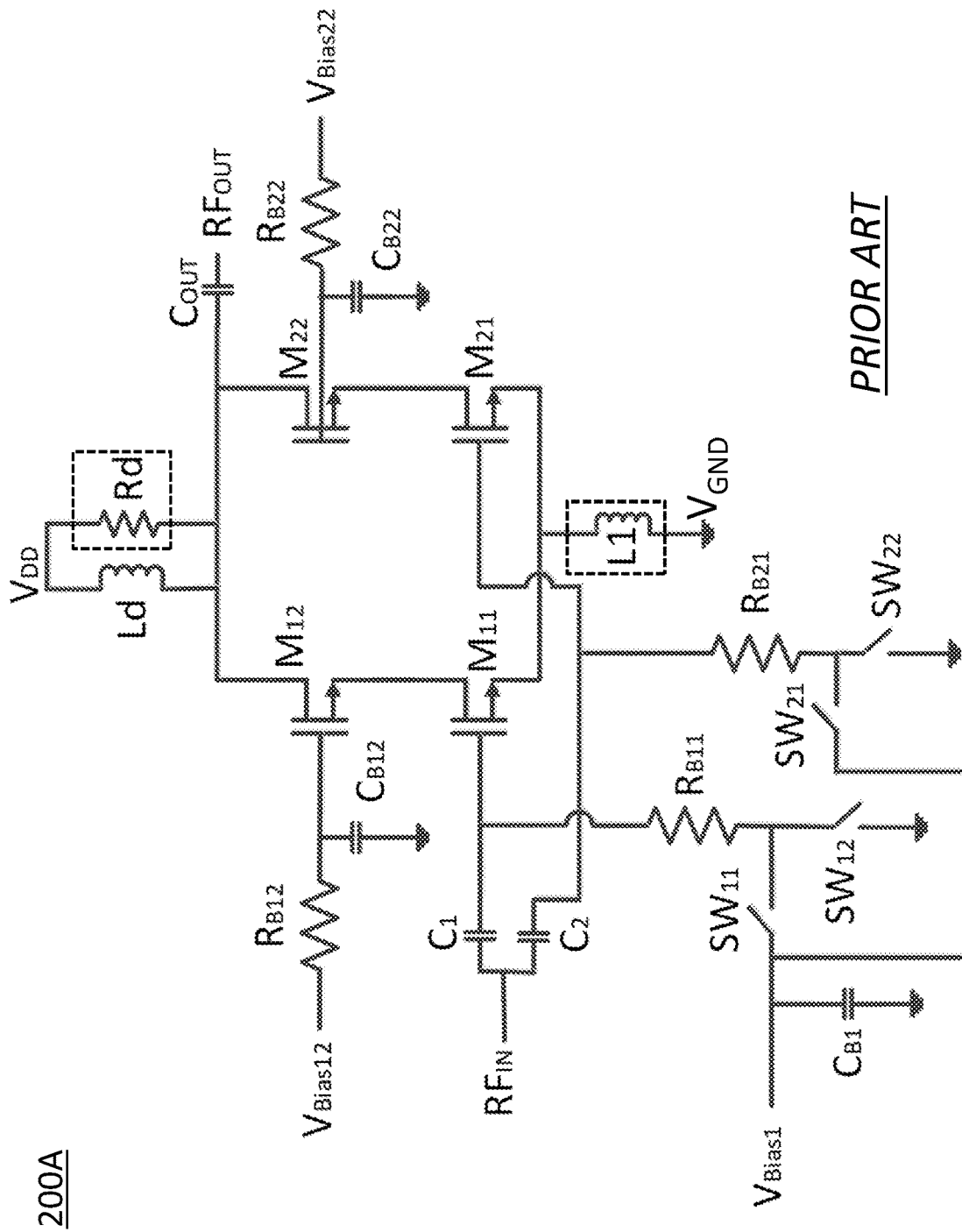
FIG. 2A shows a prior art configuration of a multi-branch cascode amplifier.

As described above with reference to FIG. 2A, by providing a same biasing voltage $V_{Bias22}$ to the gate of the output cascode transistor M22 during the ON state and the OFF state of the branch (M21, M22), the drain-to-gate voltage $V_{DG\_M22}$ of the transistor M22 can be reduced and kept, for example, within a tolerable voltage range of a thin oxide transistor (e.g., 1.32 volts). In this configuration, further protection to the transistors of the turned OFF branch (M21, M22) can be provided via a protection circuit (210) shown in FIG. 2B. The protection circuit (210) includes a resistor Rx coupled at a first terminal of the resistor Rx to a switching terminal (e.g., throw) of a switch $SW_X$ (e.g., single-pole single-throw SPST), a second terminal of the resistor Rx is coupled to a common node $N_{21}$ of the source of transistor M22 and the drain of the transistor M21, and a common terminal (e.g., pole) of the switch $SW_X$ is coupled to the reference ground, $V_{GND}$. A control signal, $V_{CTRL}$, controls a state of the switch $SW_X$ based on an ON or OFF state of the branch (M21, M22). When the branch is OFF, the switch $SW_X$ is closed and a voltage at the common node $N_{21}$ is formed based on a leakage current of the transistor M22 flowing to the reference ground, $V_{GND}$, through the resistor Rx. A resistance of Rx can be selected to provide a voltage at the common node $N_{21}$ so that the transistors M21 and M22 are not subjected to any voltage beyond their respective tolerable voltage ranges. On the other hand, when the branch is OFF, the switch $SW_X$ is open and effectively no current flows through an open circuit provided by the resistor Rx coupled to the common node $N_{21}$.

Figure 2B:
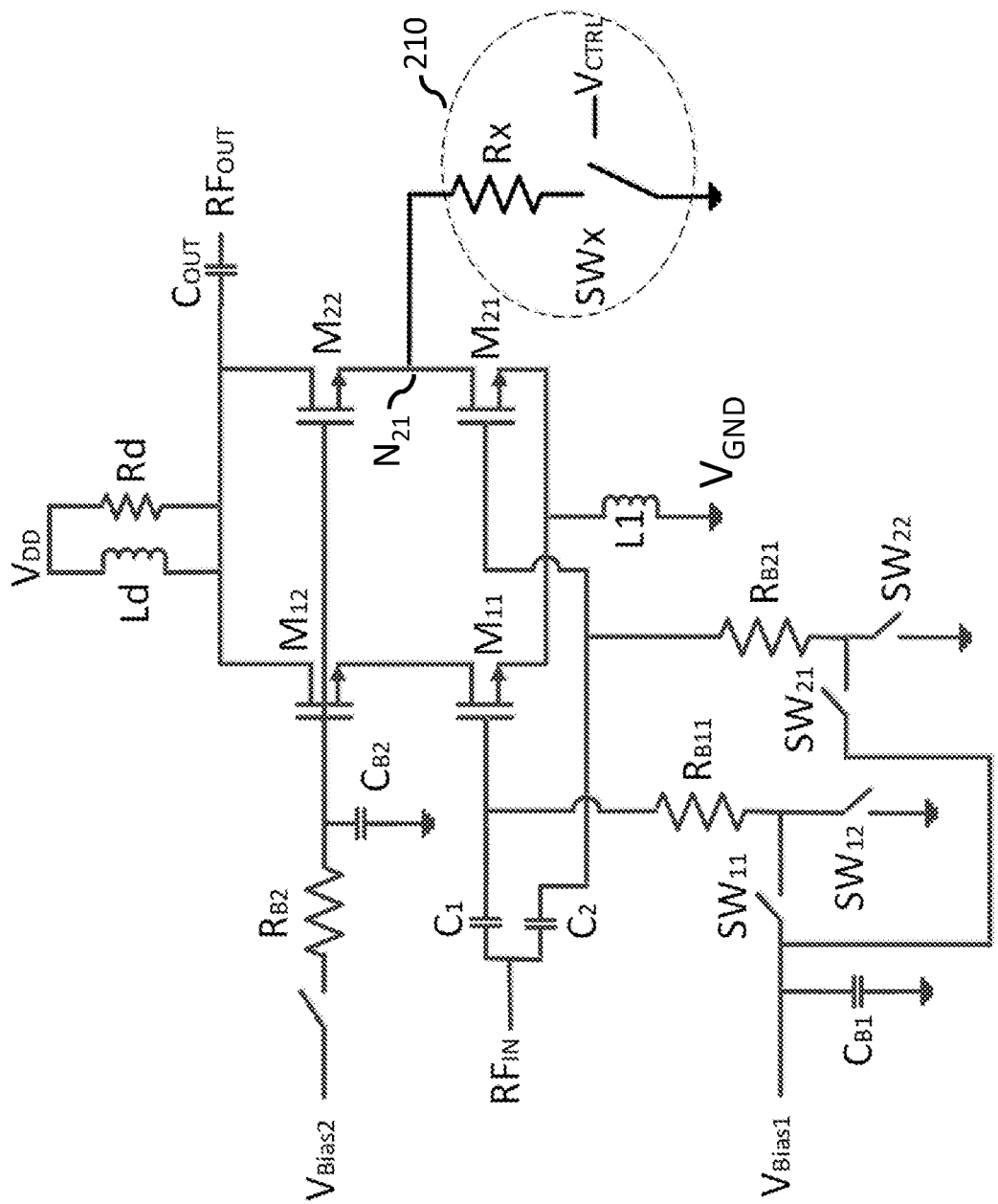
FIG. 2B shows a configuration of a multi-branch cascode amplifier, including a protection circuit that selectively couples a source node of a common-gate cascode output transistor of a branch to a reference ground.

The protection circuit (210) shown in FIG. 2B can protect the transistors M21 and M22 during the OFF state of the branch (M21, M22), and therefore allow usage of, for example, thin oxide transistors having lower maximum tolerable voltages, while having a minimum effect on the branch during the ON state of the branch. However, during the OFF state of the branch (M21, M22) the output transistor M2 is conducting (transistor is ON) and therefore, as previously described, can negatively affect performance of the amplifier (200A) as provided by other active branches.

Figure 3A:
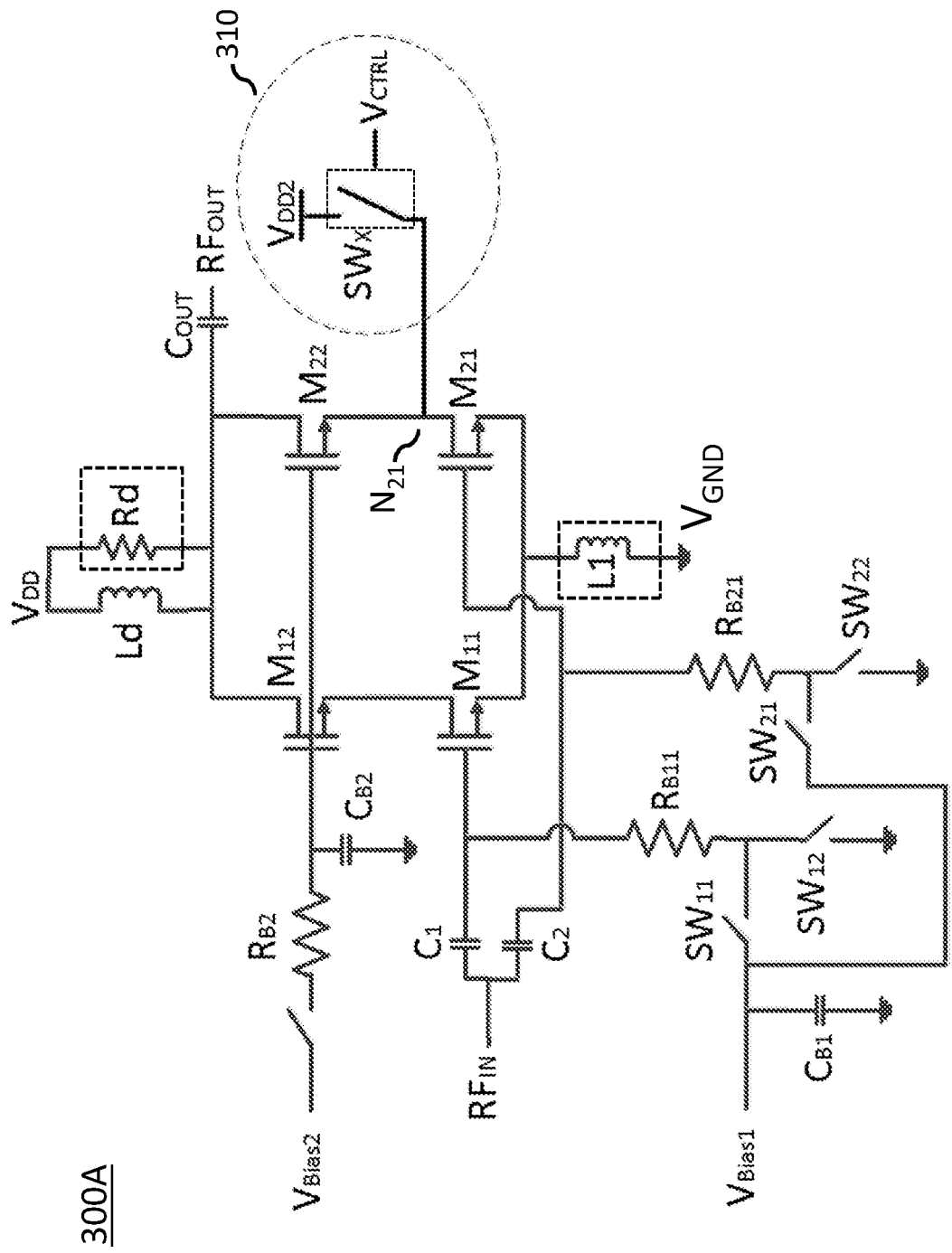
FIG. 3A shows a configuration of a multi-branch cascode amplifier according to an embodiment of the present disclosure, including a protection circuit that selectively couples a source node of a common-gate cascode output transistor of a branch to a reference voltage.
Figure 5A:
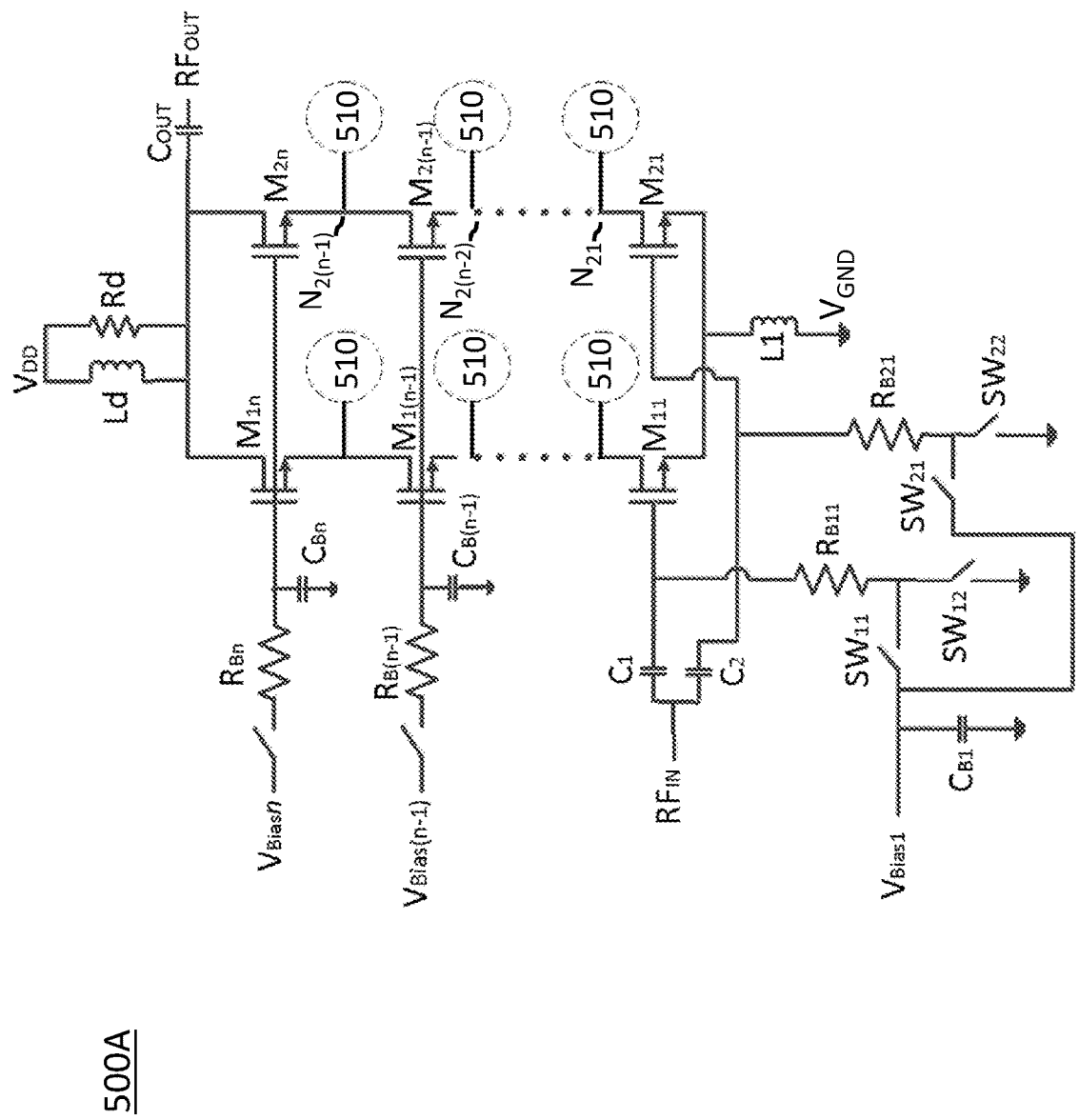
FIG. 5A shows a configuration of a multi-branch cascode amplifier according to an embodiment of the present disclosure, each branch comprising two branches, each branch comprising a plurality of common-gate cascode transistors, including protection circuits coupled to the common-gate cascode transistors of each branch.

FIG. 3A shows a configuration of a multi-branch cascode amplifier (300A) according to an embodiment of the present disclosure, including a protection circuit (310) that addresses the problem with the protection circuit (210) described with reference to FIG. 2B. As shown in FIG. 3A, the protection circuit (310) comprises a switch $SW_X$ (e.g., single-pole single-throw SPST) that selectively couples, under control of the control signal, $V_{CTRL}$, a common-gate cascode output transistor (e.g., M22) of a branch (e.g., M21, M22) to a reference voltage, $V_{DD2}$. For example, when the branch (M21, M22) is OFF, the switch $SW_X$ is closed and therefore couples the reference voltage, $V_{DD2}$, to the common node $N_{21}$, and when the branch (M21, M22) is ON, the switch is open and therefore decouples the reference voltage, $V_{DD2}$, from the common node $N_{21}$. It should be noted that although FIG. 3A shows one branch (e.g., M21, M22) comprising the protection circuit (e.g., 310), such exemplary configuration should not be considered as limiting the scope of the present teachings, as the protection circuit (310) can be provided to protect any branch (e.g., M11, M12) of a multi-branch cascode amplifier, whether including two branches (shown in FIG. 3A) or more branches (e.g., shown in FIG. 5B later described). Furthermore, teachings according to the present disclosure equally apply to multi-branch cascode amplifiers whose branches include more than a single common-gate cascode transistor as shown in FIG. 5A and FIG. 5C later described.

With continued reference to FIG. 3A, when the branch (M21, M22) is OFF, the reference voltage $V_{DD2}$ defines the source voltage of the transistor M22 and the drain voltage of the transistor M21. According to an embodiment of the present disclosure, a voltage level of the reference voltage $V_{DD2}$ is chosen so that the M22 transistor does not conduct any current (i.e., M22 is OFF). This can be achieved if a gate-to-source voltage $V_{GS\_M22}$ of the transistor M22 is negative. As understood by a person skilled in the art, transistor M22 is OFF if: $V_{G\_M22} - V_{S\_M22} < 0$, or, since $V_{S\_M22} = V_{DD2}$, transistor M22 is OFF if: $V_{DD2} > V_{G\_M22}$. On the other hand, the reference voltage, $V_{DD2}$ also defines a drain-to-source voltage $V_{DS\_M21}$ and drain-to-gate voltage $V_{DG\_M21}$ of the input transistor M21 which has to be kept within a tolerable voltage range of the transistor M21. If such tolerable voltage range is defined by a maximum value, $V_{DS\_M21\_MAX}$ or $V_{DG\_M21\_MAX}$, then according to an embodiment of the present disclosure, the voltage $V_{DD2}$ can be chosen such that: $V_{DS\_M21\_MAX} > V_{DD2} > V_{G\_M22}$ and $V_{DG\_M21\_MAX} > V_{DD2}$. Such value of the reference voltage $V_{DD2}$, together with the protection circuit (310) allows: a) applying a same biasing voltage to the gate of the output cascode transistor during the ON state and the OFF state of the branch (M21, M22) and therefore allows usage of, for example, thin-oxide transistors, b) protecting the transistors M21 and M22 during the OFF state of the branch from voltages higher than their tolerable voltage ranges, and c) complete turn OFF of an OFF branch to reduce impact of the OFF branch on a performance of the multi-branch amplifier provided by other turned ON branches.

According to an exemplary embodiment of the present disclosure, $V_{DD2}$ can be the supply voltage $V_{DD}$. Because the biasing voltage at the gate of the output cascode transistor M22 is smaller than a level of the supply voltage $V_{DD}$, using such supply voltage as the reference voltage coupled to the switch $SW_X$ of the protection circuit (310) of FIG. 3A would satisfy the requirements for the level of the reference voltage $V_{DD2}$ described above, and therefore can provide the above-described benefits.

Figure 3B:
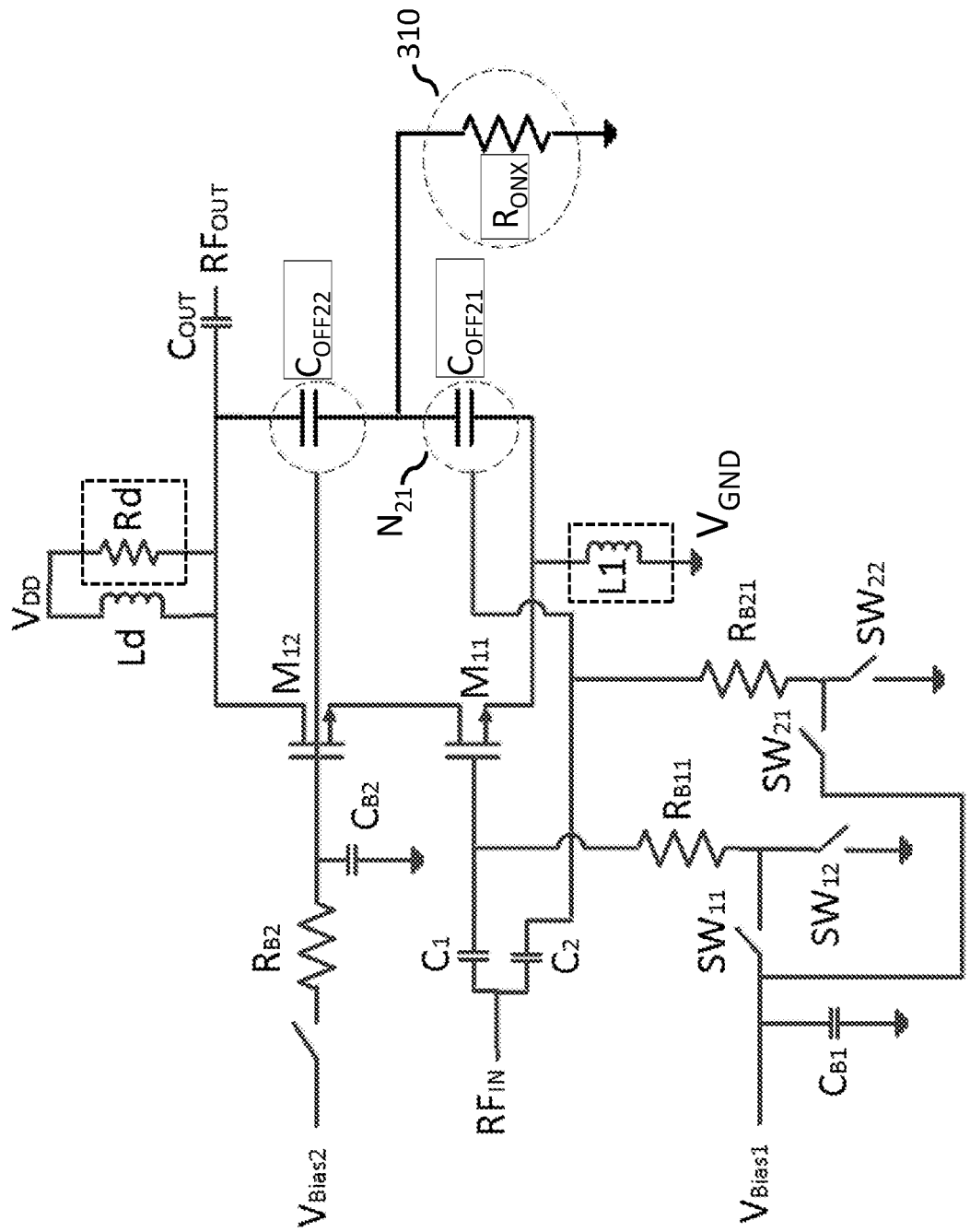
FIG. 3B shows an equivalent representation of the configuration of FIG. 3A for a case of a turned OFF branch.
Figure 3C:
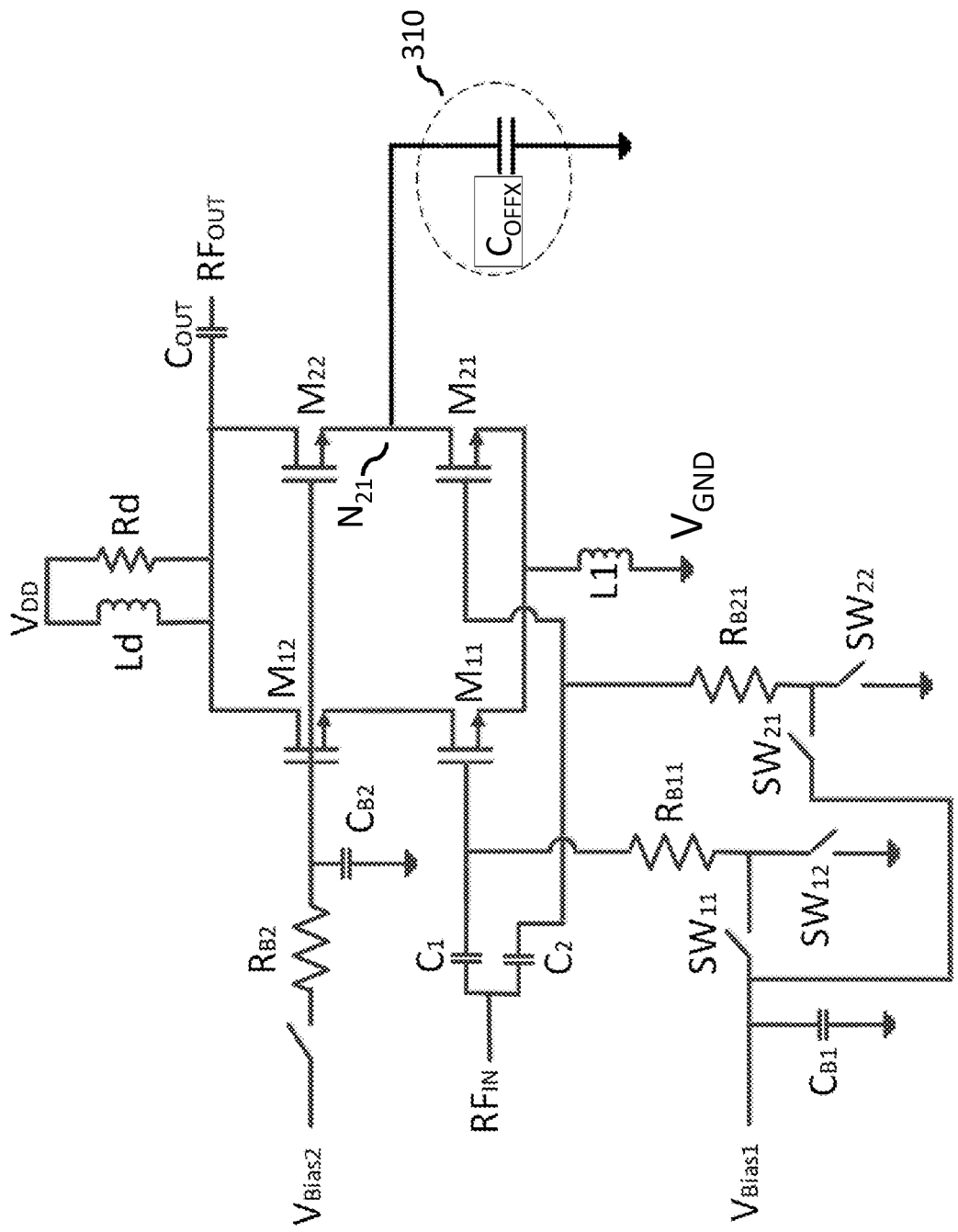
FIG. 3C shows an equivalent representation of the configuration of FIG. 3A for a case of a turned ON branch.

According to an exemplary embodiment of the present disclosure, the switch $SW_X$ can be an electromechanical switch, a MEMS switch, a semiconductor switch, a transistor switch, or any other switch configuration known to a person skilled in the art that can provide a sufficiently low on resistance, $R_{ON}$, when the switch is closed (i.e., branch is OFF), and a sufficiently low off capacitance, $C_{OFF}$, when the switch is open (i.e., branch is ON). FIG. 3B and FIG. 3C provide equivalent representations of a turned ON and turned OFF branch including the protection circuit (310) at RF frequencies.

FIG. 3B shows an equivalent representation at RF frequencies of the configuration of FIG. 3A for a case of a turned OFF branch (M21, M22), including respective off capacitances $C_{OFF21}$ and $C_{OFF22}$ of the transistors M21 and M22 (neither conducts), and on resistance, $R_{ONX}$ of the switch $SW_X$. A person skilled in the art would clearly understand such representation of the branch (M21, M22) in the OFF state of the branch, including the equivalent reference ground, $V_{GND}$, coupling provided by the reference voltage, $V_{DD2}$, at the RF frequencies.

With continued reference to FIG. 3B, the off capacitances $C_{OFF21}$ and $C_{OFF22}$ of the transistors M21 and M22 form a capacitive voltage divider that divides an RF voltage (e.g., provided by other ON branches) having an amplitude $V_0$ at the drain of the output cascode transistor M22 (common to the drain of the output cascode transistor M12), and provides a divided version of the RF voltage at the common node $N_{21}$ having an amplitude $V_{N21}$ that is approximately equal to $V_0 * C_{OFF22}/(C_{OFF21} + C_{OFF22})$. As a result, and assuming that the on resistance, $R_{ONX}$, of the switch $SW_X$ is absent (e.g., relatively high impedance value), during the OFF state of the branch (M21, M22), a peak voltage at the common node $N_{21}$ can be represented by a combination of a DC voltage $V_{DD2}$, and the AC voltage $V_0 * C_{OFF22}/(C_{OFF21} + C_{OFF22})$, or the sum $V_{DD2} + V_0 * C_{OFF22}/(C_{OFF21} + C_{OFF22})$, which can be sufficiently high to damage the input transistor M21 (e.g., due to high drain-to-source and/or drain-to-gate voltage of M21). This highlights a requirement to choose a switch $SW_X$ having an on resistance, $R_{ONX}$, that allows reducing of the peak voltage at the common node, $N_{21}$, as described below.

With continued reference to FIG. 3B, according to an exemplary embodiment of the present disclosure, the switch $SW_X$ is chosen so that $R_{ONX} \leq 0.1*(1/j\omega C_{OFF21})$ wherein $\omega = 2\pi f$; f is the highest frequency component of the RF signal; and j is the unit imaginary number. By choosing a switch $SW_X$ with a sufficiently low on resistance, $R_{ONX}$, compared to an impedance $(1/j\omega C_{OFF21})$ of the off capacitance $C_{OFF21}$ at the frequencies of operation of the RF signal, a combined parallel impedance $R_{ONX} \| (1/j\omega C_{OFF21})$ can be approximated to $R_{ONX}$. Therefore, for such sufficiently low on resistance, $R_{ONX}$, of the switch $SW_X$, a peak voltage at the common node $N_{21}$ can be represented by a combination of a DC voltage $V_{DD2}$, and the AC voltage $V_0 * R_{ONX}/(R_{ONX} + (1/j\omega C_{OFF22})) = V_0 *(j\omega * C_{OFF22} * R_{ONX})$, or in other words, by the sum $V_{DD2} + V_0 *(j\omega C_{OFF22} * R_{ONX})$, which can be sufficiently low to be within the tolerable voltage range of the input transistor M21. According to an exemplary embodiment of the present disclosure, a value of the resistance $R_{ONX}$ may be chosen to be less than one tenth the impedance value of the off capacitance $C_{OFF21}$ described above. In such embodiment, the peak voltage at the common node $N_{21}$ is about $V_{DD2}+0.1*V_0$.

FIG. 3C shows an equivalent representation at RF frequencies of the configuration of FIG. 3A for a case of a turned ON branch (M21, M22), including an off capacitance, $C_{OFFX}$, of the switch $SW_X$. According to an embodiment of the present disclosure, the switch $SW_X$ can be chosen so that its off capacitance, $C_{OFFX}$, is sufficiently low so that it does not negatively impact performance of the turned ON branch (M21, M22). In other words, the impedance of the off capacitance, $C_{OFFX}$, of the switch $SW_X$ at the frequencies of operation of the RF signal is sufficiently high so as not to affect the RF signal at the common node $N_{21}$ during amplification of the RF signal through the branch (M21, M22).

Figure 3D:
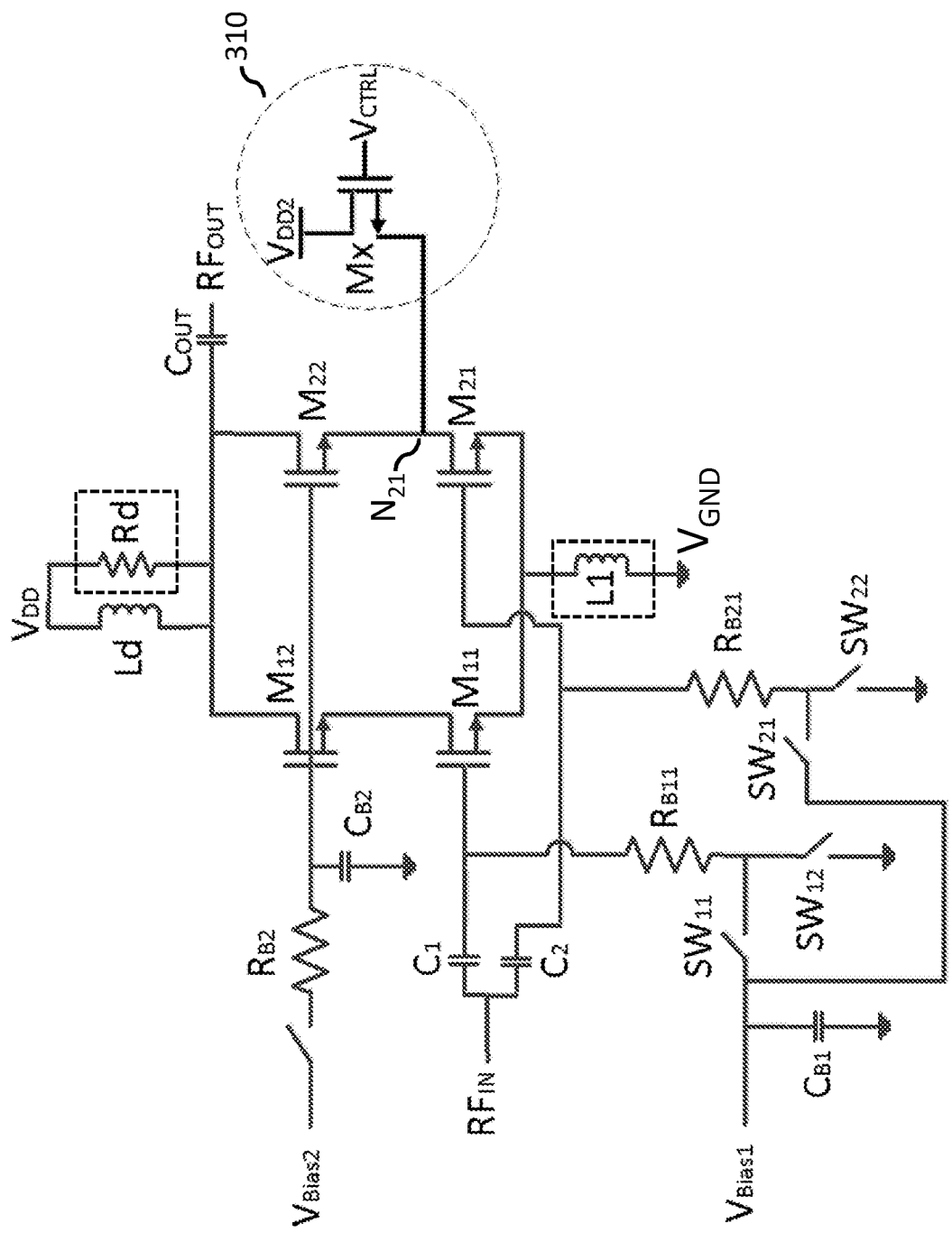
FIG. 3D shows the configuration of FIG. 3A for an exemplary implementation of the protection circuit using a transistor switch.

As shown in FIG. 3D, according to an exemplary embodiment of the present disclosure, the switch $SW_X$ used in the protection circuit (310) of FIG. 3A can be a transistor switch Mx. For example, the transistor switch Mx can be an NMOS (FET) transistor switch as shown in FIG. 3D with a drain node coupled to the reference voltage, $V_{DD2}$, the source node coupled to the common node $N_{21}$, and a gate node coupled to the control signal, $V_{CTRL}$. Alternatively, the transistor switch Mx can be a PMOS (FET) transistor switch so long as it can satisfy requirements for its on resistance, $R_{ONX}$, and off capacitance, $C_{OFFX}$, as described above with reference to FIG. 3B and FIG. 3C. For example, a size of the transistor switch Mx can be chosen to be small enough to provide a sufficiently low off capacitance, $C_{OFFX}$, and a level of the control voltage, $V_{CTRL}$, can be chosen to be sufficiently high to provide a low on resistance, $R_{ONX}$, when the transistor switch Mx is conducting (i.e., switch is closed).

As understood by a person skilled in the art, the on resistance, $R_{ONX}$, of the transistor switch Mx shown in FIG. 3D may be a function of a gate-to-source voltage provided to the transistor via a voltage level of the control signal, $V_{CTRL}$, wherein a higher value of the gate-to-source voltage provides a lower value of the on resistance, $R_{ONX}$. In some cases, setting the voltage level of the control signal, $V_{CTRL}$, for turning ON the transistor switch Mx to the level of the supply voltage, $V_{DD}$, may be sufficiently high to provide a sufficiently low on resistance, $R_{ONX}$, of the transistor switch, Mx. In cases where the level of the supply voltage, $V_{DD}$, is not sufficiently high, a higher voltage level of the control signal, $V_{CTRL}$, for turning ON the transistor switch Mx may be provided by a level shifter that provides a level-shifted version of the supply voltage, $V_{DD}$. A person skilled in the art is well aware of various implementation designs and circuits for generating such level-shifted voltage, which designs are beyond the scope of the present application. On the other hand, the level of the control signal, $V_{CTRL}$, for turning OFF the transistor switch Mx may be set to, for example, zero Volts (e.g., short to $V_{GND}$). It should be noted that because higher voltage levels may be applied to the transistor switch Mx shown in FIG. 3D, such transistor may be chosen to be a thick-oxide transistor which inherently provides a higher maximum tolerable voltage for a given fabrication process.

Figure 4A:
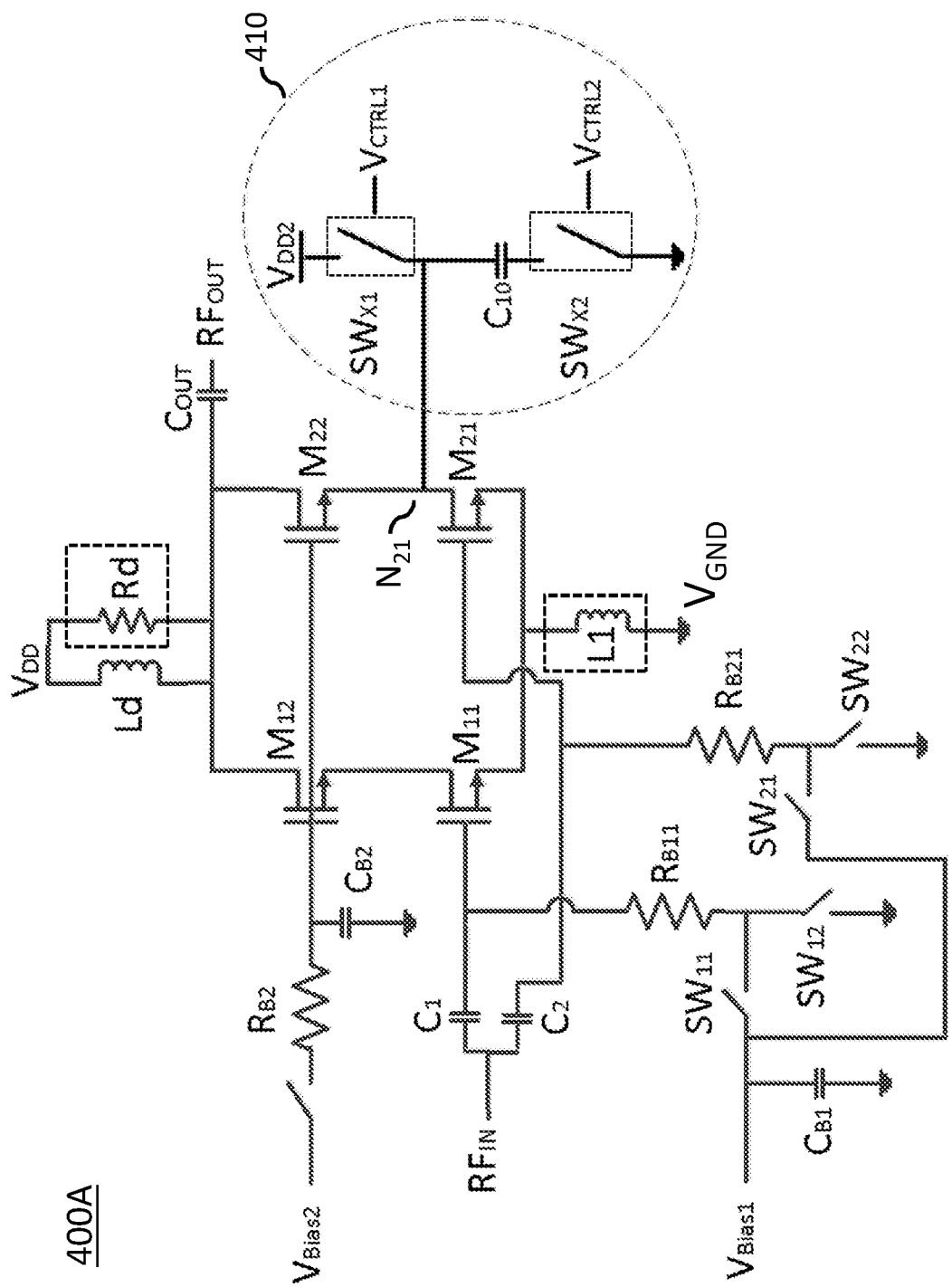
FIG. 4A shows a configuration of a multi-branch cascode amplifier according to an embodiment of the present disclosure, including a protection circuit that selectively couples a source node of a common-gate cascode output transistor of a branch to one of a reference voltage and a reference ground.

FIG. 4A shows a configuration of a multi-branch cascode amplifier (400A) according to another embodiment of the present disclosure, including a protection circuit (410) that addresses the problem with the protection circuit (210) described with reference to FIG. 2B. As shown in FIG. 4A, the protection circuit (410) comprises a first switch $SW_{X1}$ (e.g., single-pole single-throw SPST) that similarly to the switch $SW_X$ of the protection circuit (310) of FIG. 3A, selectively couples, under control of the control signal, $V_{CTRL1}$, the common node, $N_{21}$, at the source of common-gate cascode output transistor (e.g., M22) of a branch (e.g., M21, M22), to a reference voltage, $V_{DD2}$. In addition to the first switch, $SW_{X1}$, the protection circuit (410) includes a second switch, $SW_{X2}$, which selectively couples (at RF frequencies of operation) the common node, $N_{21}$, to the reference ground, $V_{GND}$, through a capacitor, C10. As can be seen in FIG. 4A, the capacitor C10 is coupled to the common node, $N_{21}$, at a first terminal of the capacitor C10, and is coupled to a switching terminal (e.g., throw) of the second switch, $SW_{X2}$, at a second terminal of the capacitor C10. Furthermore, a common terminal (e.g., pole) of the second switch, $SW_{X2}$, is coupled to the reference ground, $V_{GND}$.

Figure 4B:
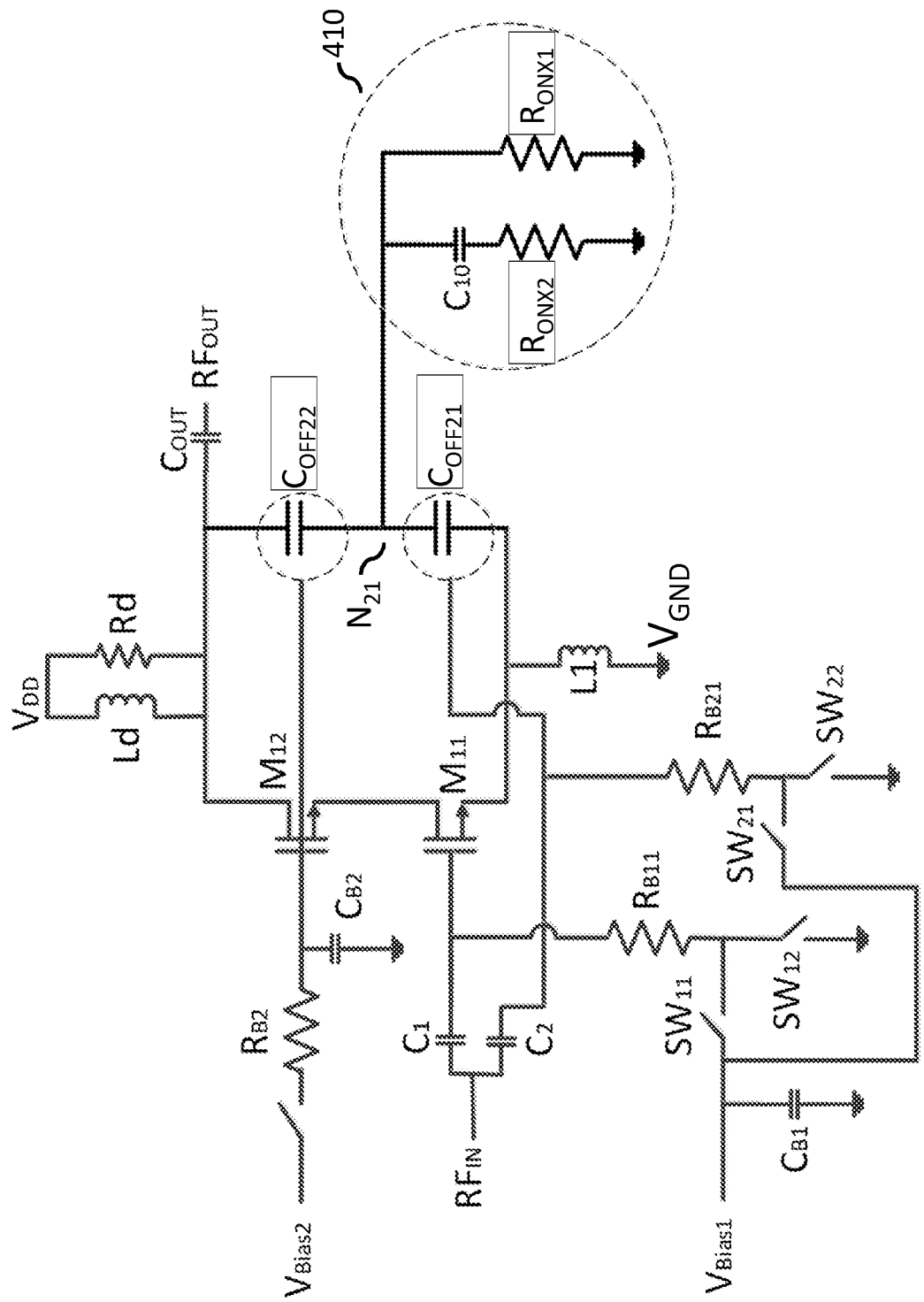
FIG. 4B shows an equivalent representation of the configuration of FIG. 4A for a case of a turned OFF branch.

FIG. 4B shows an equivalent representation at RF frequencies of the configuration of FIG. 4A for a case of a turned OFF branch (M21, M22), including respective off capacitances $C_{OFF21}$ and $C_{OFF22}$ of the transistors M21 and M22 (neither conducts); an on resistance, $R_{ONX1}$ of the first switch $SW_{X1}$, and an on resistance, $R_{ONX2}$ of the second switch $SW_{X2}$ in series connection with the capacitor C10. As clearly understood by a person skilled in the art, during the OFF state of the branch (M21, M22), the combination of the series-connected capacitor C10 and an on resistance, $R_{ONX2}$ of the second switch, $SW_{X2}$, can allow further control of an impedance value (at the frequencies of operation) between the common node $N_{21}$ and the reference ground, $V_{GND}$, at the frequencies of operation of the RF signal, and therefore control of an amplitude of an AC component at the common node $N_{21}$. On the other hand, during the OFF state of the branch (M21, M22), the capacitor C10 can block any DC path (e.g., for a leakage current) to the reference ground, $V_{GND}$, and therefore maintain the cascode transistor M22 turned OFF via application of the reference voltage, $V_{DD2}$, at the common node $N_{21}$.

With continued reference to FIG. 4B, by choosing the capacitor C10 and the second switch, $SW_{X2}$, such that a corresponding combined impedance value (C10 in series with $R_{ONX2}$) at the frequencies of operation of the RF signal is substantially lower than an impedance value (i.e., $R_{ONX1}$) of the first switch, $SW_{X1}$, the effect of a higher impedance value of the first switch, $SW_{X1}$, on an amplitude of an AC component at the common node, $N_{21}$, can be canceled. In other words, the first switch, $SW_{X1}$, may be chosen to present a higher value on resistance, $R_{ONX1}$, without affecting effectiveness of the protection circuit (410) in protecting the input transistor M21 in the OFF state of the branch (M21, M22). It should be noted that such higher value of the on resistance, $R_{ONX1}$, may not necessarily be based on a design choice, but rather on a design constraint. For example, as described above with reference to FIG. 3D, in a case of a transistor based switch (e.g., $SW_{X1}$ of FIG. 3D), a size of the switch may be chosen in view of an off capacitance, $C_{OFFX}$, of the switch, and the on resistance value, $R_{ONX}$, may be lowered by applying a larger voltage control signal, $V_{CTRL}$. However, such larger voltage, as provided for example by a level shifter, may not necessarily be available in a target system of the multi-branch amplifier. As clearly understood by a person skilled in the art, the various embodiments of the protection circuit according to the present teachings may be adapted to different voltage levels available in different target systems.

With continued reference to FIG. 4B, according to an exemplary embodiment of the present disclosure, the second switch, $SW_{X2}$, and the capacitor C10 may be chosen such that the combined impedance $R_{ONX2}+1/j\omega C10$ is substantially smaller than $R_{ONX1}$ at the frequencies of operation of the RF signal (e.g., at the lowest frequency of operation). Accordingly, the parallel impedance $Z_{410}=R_{ONX1}\|(R_{ONX2}+$ $1/j\omega C10$) seen at the common node, $N_{21}$, contributed by the protection circuit (410) can be approximated to $Z_{410}=R_{ONX2}+1/j\omega C10$. Furthermore, by choosing a value of the capacitor C10 and the switch $SW_{X2}$ such that at the frequencies of operation of the RF signal: $Z_{410}=R_{ONX2}+1/j\omega C10 \leq 0.1*(1/j\omega C_{OFF21})$, then for such sufficiently low on impedance presented by the protection circuit (410), a peak voltage at the common node $N_{21}$ can be represented by a combination of a DC voltage $V_{DD2}$, and the AC voltage $V_0*Z_{410}/(Z_{410}+1/j\omega C_{OFF22})$, or in other words, by the sum $V_{DD2}+V_0*Z_{410}/(Z_{410}+1/j\omega C_{OFF22})$, which can be sufficiently low to be within the tolerable voltage range of the input transistor M21 (i.e., smaller than a maximum limit of a drain-to-source voltage and a drain-to-gate voltage).

Figure 4C:
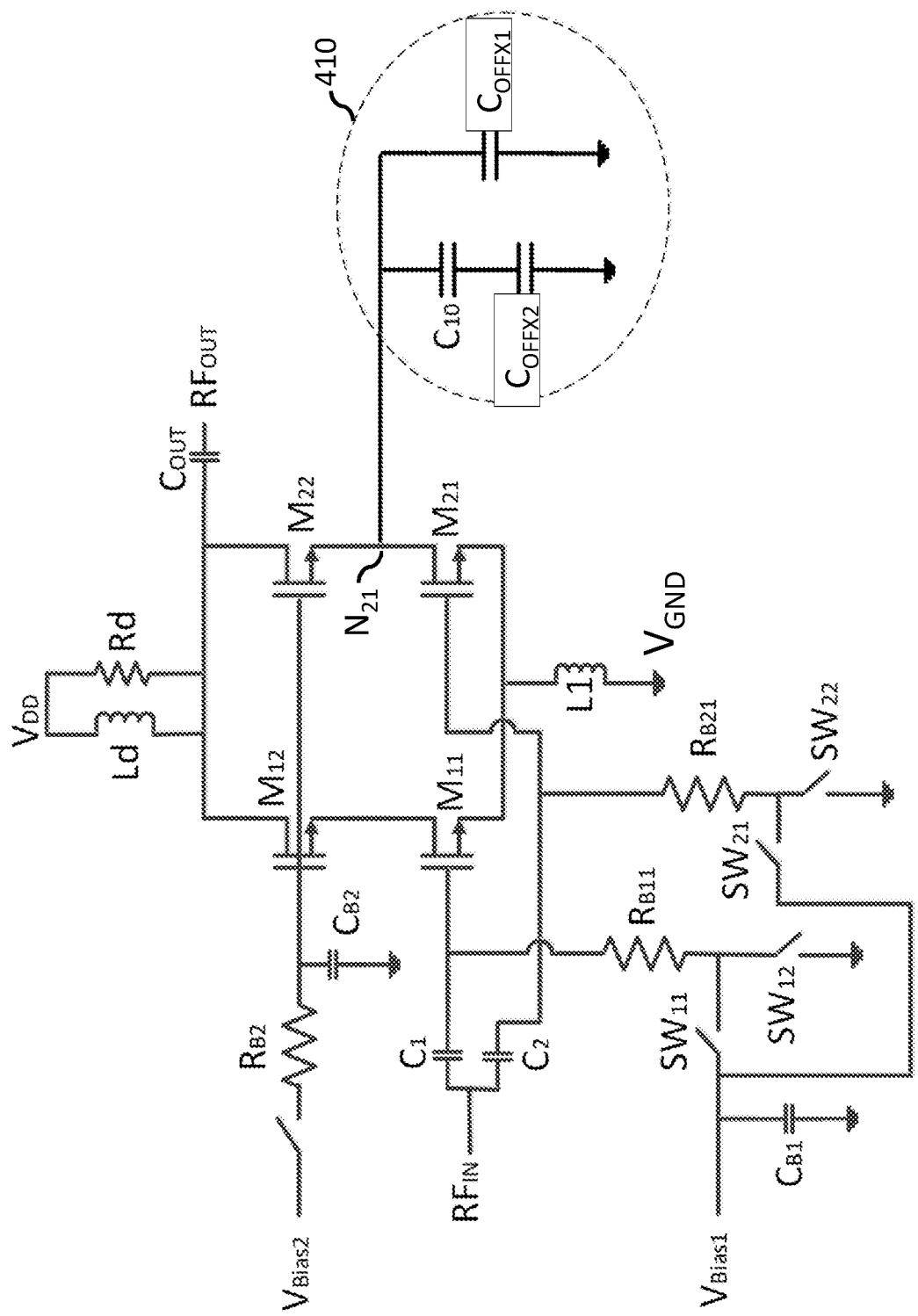
FIG. 4C shows an equivalent representation of the configuration of FIG. 4A for a case of a turned ON branch.

FIG. 4C shows an equivalent representation at RF frequencies of the configuration of FIG. 4A for a case of a turned ON branch (M21, M22), including an off capacitance, $C_{OFFX1}$, of the switch $SW_{X1}$ and off capacitance, $C_{OFFX2}$, of the switch $SW_{X2}$. According to an embodiment of the present disclosure, the switches SWx1 and SWx2 can be chosen so that their respective off capacitances, $C_{OFFX1}$ and $C_{OFFX2}$ are sufficiently low so that they do not impact performance of the turned ON branch (M21, M22). In other words, the impedance of each of the off capacitances, $C_{OFFX1}$ and $C_{OFFX2}$, of the switches $SW_{X1}$ and $SW_{X2}$ at the frequencies of operation of the RF signal is sufficiently high so as not to affect the RF signal at the common node $N_{21}$ during amplification of the RF signal through the branch (M21, M22).

Figure 4D:
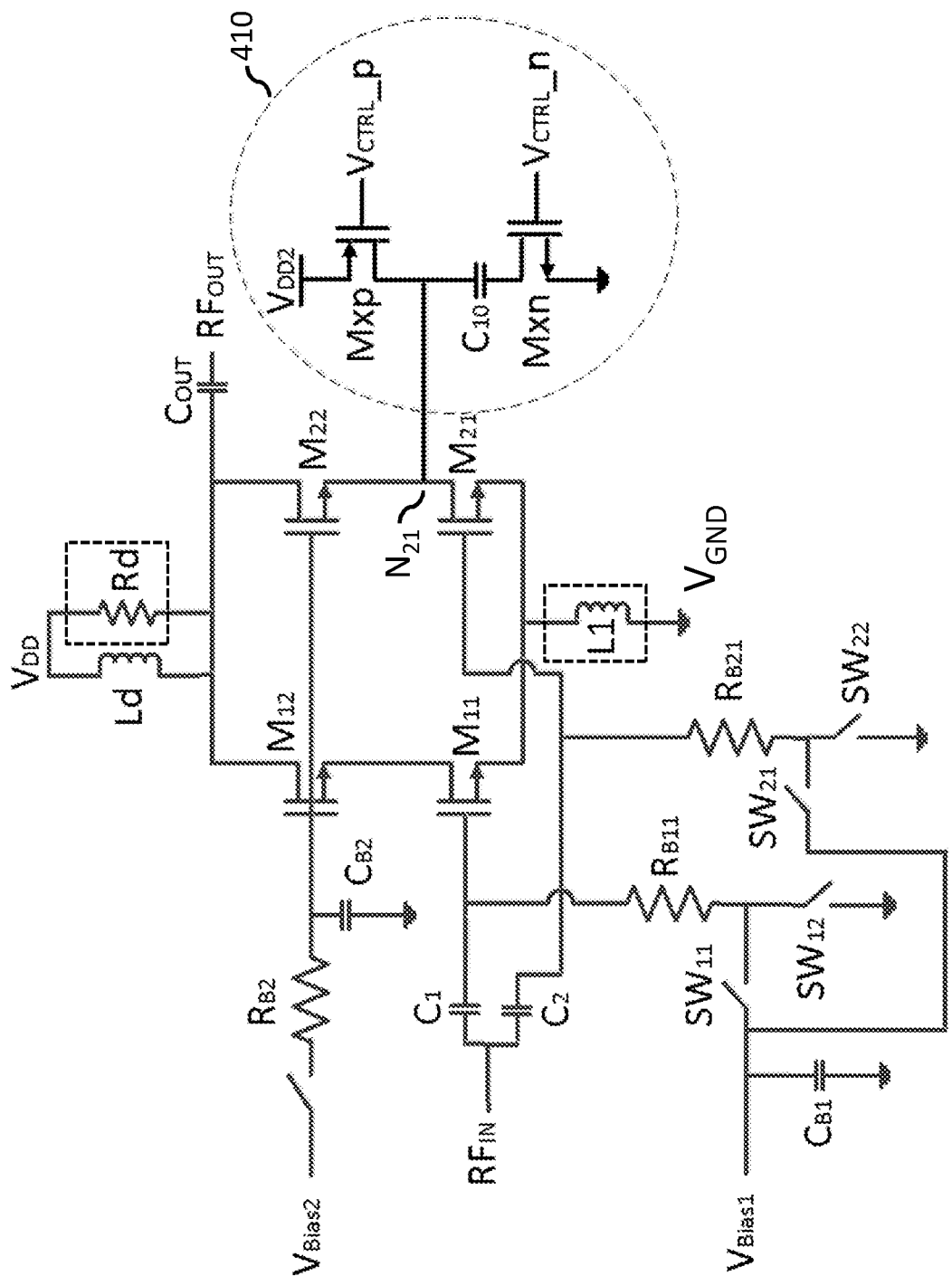
FIG. 4D shows the configuration of FIG. 4A for an exemplary implementation of the protection circuit using transistor switches.

As shown in FIG. 4D, according to an exemplary embodiment of the present disclosure, the switches $SW_{X1}$ and $SW_{X2}$ used in the protection circuit (410) of FIG. 4A can be transistor switches Mxp and Mxn. For example, as shown in FIG. 4D, the transistor switch Mxp can be a PMOS transistor switch with a source node coupled to the reference voltage, $V_{DD2}$, the drain node coupled to the common node $N_{21}$, and a gate node coupled to the control signal, $V_{CTRL\_P}$. Additionally, as shown in FIG. 4D, the transistor switch Mxn can be an NMOS transistor switch with the source node coupled to the reference ground, $V_{GND}$, the drain node coupled to the capacitor C10, and the gate node coupled to a control signal, $V_{CTRL}$ N. It should be noted that the teachings according to the present disclosure of the protection circuit (410) shown in FIG. 4D are not limited to the specific transistor types shown, and therefore any transistor switch, including NMOS or PMOS, can be used for any of the switches $SW_{X1}$ and $SW_{X2}$, so long as the transistor switches can satisfy requirements for their respective on resistances and off capacitances described above with reference to FIG. 4B and FIG. 4C.

With continued reference to FIG. 4D, according to an exemplary embodiment of the present disclosure, a size of the PMOS transistor switch Mxp can be chosen to be small enough to provide a sufficiently low off capacitance, $C_{OFFX1}$. A person skilled in the art would know that given the current state of transistor fabrication technology, for a given transistor size, a PMOS transistor may exhibit a higher on resistance compared to an NMOS transistor. Therefore, the small size PMOS transistor switch Mxp shown in FIG. 4D, the small size chosen to provide a sufficiently low off capacitance for a reduced impact on the RF signal when the branch is ON, may present a relatively high on resistance, (e.g., $R_{ONX1}$ of FIG. 4B) that may not be sufficiently low to protect the input transistor M21 when the branch is OFF. However, by choosing the capacitance C10 and a size of the NMOS transistor switch Mxn to satisfy requirements for its on resistance and off capacitance described above with reference to FIG. 4B and FIG. 4C, a level of the AC voltage at the common node, $N_{21}$, can be sufficiently reduced so as to protect the input transistor M21 when the branch (M21, M22) is OFF. In addition, since the on resistance of the PMOS transistor Mxp is not required to be largely reduced, a voltage level provided by the control signal, $V_{CTRL\_P}$ to turn ON the PMOS transistor Mxp can be relatively low, such as, for example, equal to $V_{GND}$. Accordingly, the configuration of the protection circuit (410) may be suitable for integration of the multi-branch amplifier (400A) shown in FIG. 4A in target system having supply voltages of limited level.

FIG. 5A shows a configuration of a multi-branch cascode amplifier (500A) according to an embodiment of the present disclosure comprising two branches, (M11, . . . , M1n) and (M21, . . . , M2n), each branch comprising a plurality of common-gate cascode transistors, (M12, . . . , M1n) and (M22, M2n) and respective common-source input transistors M11 and M12. Furthermore, as shown in FIG. 5A, each branch includes respective protection circuits (510) coupled to the sources of the common-gate cascode transistors of the branch, wherein each protection circuit (510) may be any one of the protection circuits described above (e.g., 310, 410). As shown in FIG. 5A, a same biasing voltage ($V_{Bias2}$, . . . , $V_{Biasn}$) can be provided to each common-gate cascode transistor of a branch in either the ON state or the OFF state of the branch. In the OFF state of a branch, all cascode transistors and the input transistor of the branch may be turned OFF, wherein as described above, the turning OFF of the cascode transistors may be provided by coupling a reference voltage to a source node of the cascode transistors via the protection circuits (510). A person skilled in the art would clearly know how to apply the above teachings to the configuration shown in FIG. 5A. Furthermore, it should be noted that as shown in the multi-branch amplifiers (300A, 400A, 500A) of FIGS. 3A, 4A, and 5A, control of the current through such amplifiers is provided by selectively activating one or more of the branches, each branch contributing to a portion of the current through the amplifiers that is based on, for example, a sizing of the branch, and not by adjusting biasing voltages to the gates of the transistors of the branches as known to a person skilled in the art. By maintaining constant gate biasing voltages to the branches, optimum performance of each branch can be maintained. Finally, during a deactivated mode of the amplifiers (e.g., 300A, 400A, 500A) wherein all of the branches are turned OFF, biasing voltages to the gates of the cascode transistors as well as the input transistors of all the branches may be set to zero volts (e.g., gates shorted to $V_{GND}$) so long as the protection circuits do not couple the reference voltages to the branches.

Furthermore, it should be noted that although in the exemplary configuration of FIG. 5A each (source node of a) common-gate cascode transistor of each branch is shown coupled to a respective protection circuit (510), according to some embodiments of the present disclosure, one or more, and not necessarily all, of the common-gate cascode transistors of each branch is coupled to a respective protection circuit (510). In general, the closer a common-gate cascode transistor is to the output (common drain node of all the output cascode transistors), the larger the AC component (e.g., $V_0$) at the source node of such common-gate cascode transistor may be, and therefore, the more susceptible the corresponding transistor whose drain node is coupled to the source node of said common-gate cascode transistor may be to being subjected to higher voltage levels (and therefore requiring protection). It should also be noted that elements (switches, capacitors) of each protection circuit (510) may be sized according to the sizes of the transistors to which the protection circuit is coupled according to the description provided above with reference to FIGS. 3B-3C and FIGS. 4B-4C. Furthermore, it should be noted that although not shown in FIG. 5A, each protection circuit (510) may be coupled to a same or different supply voltages (e.g., $V_{DD2}$ coupled to (410) of FIG. 4A), and may be controlled via control lines shared amongst the protection circuits (510) or via individual control lines to each of the control circuits (510).

With continued reference to FIG. 5A, turning OFF of the cascode transistors (e.g., M22, . . . , M2n) of a turned OFF branch (e.g., M21, M2n) may be provided by a reference voltage (e.g., $V_{DD2}$) coupled to a common node (e.g., N21, . . . , N2(n−1)) of the branch (e.g., M21, . . . , M2n) through a respective protection circuit (510). In particular, a level of the reference voltage, $V_{DD2}$, provided to the protection circuit (510) may be scaled according to a position of the common node, (e.g., N21, . . . , N2(n−1)) in the stacked transistor configuration to which the protection circuit (510) is coupled. Applying the above teachings to the configuration of FIG. 5A, a person skilled in the art would clearly establish that a level of a reference voltage, $V_{DD2}k$ of a protection circuit (510k) that is coupled to a common node, $N_{2k}$, of the branch (M21, . . . , M2n), can be provided by the expressions: $V_{DS\_M2k\_MAX} + V_{S\_M2k} > V_{DD2k} > V_{G\_M2(k+1)}$ and $V_{DG\_M2k\_MAX} + V_{G\_M2k} > V_{DD2k}$, wherein: $V_{DS\_M2k\_MAX}$ and $V_{DG\_M2k\_MAX}$, respectively, represent maximum values of tolerable drain-to-source and drain-to-gate voltage range of a transistor M2k whose drain node is coupled to the common node $N_{2k}$; and $V_{G\_M2(k+1)}$ represents a gate voltage (e.g., $V_{Bias(k+1)}$) of a transistor M2(k+1) whose source node is coupled to the common node $N_{2k}$.

Figure 5B:
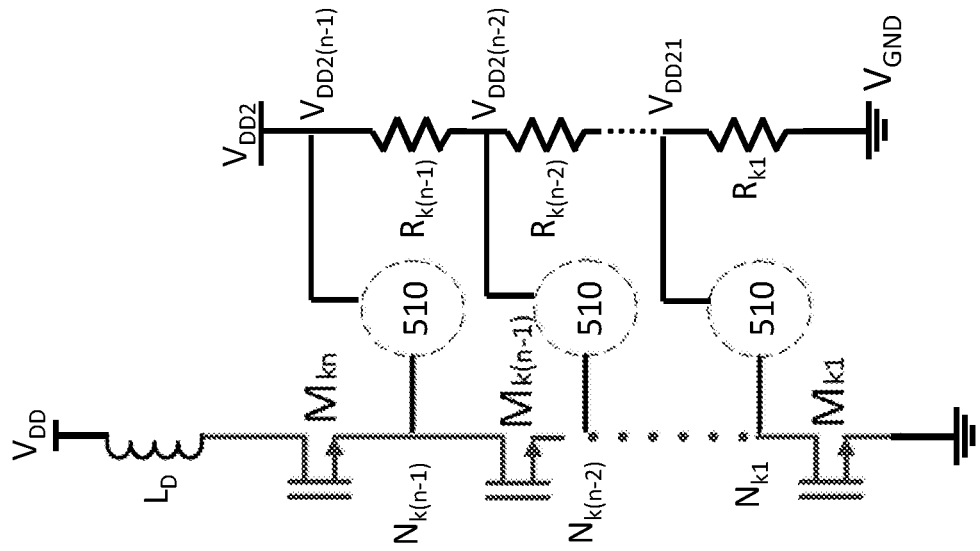
FIG. 5B shows a circuital arrangement for providing reference voltages to the protection circuits of the configurations of FIG. 5A (or FIG. 5C).
Figure 5C:
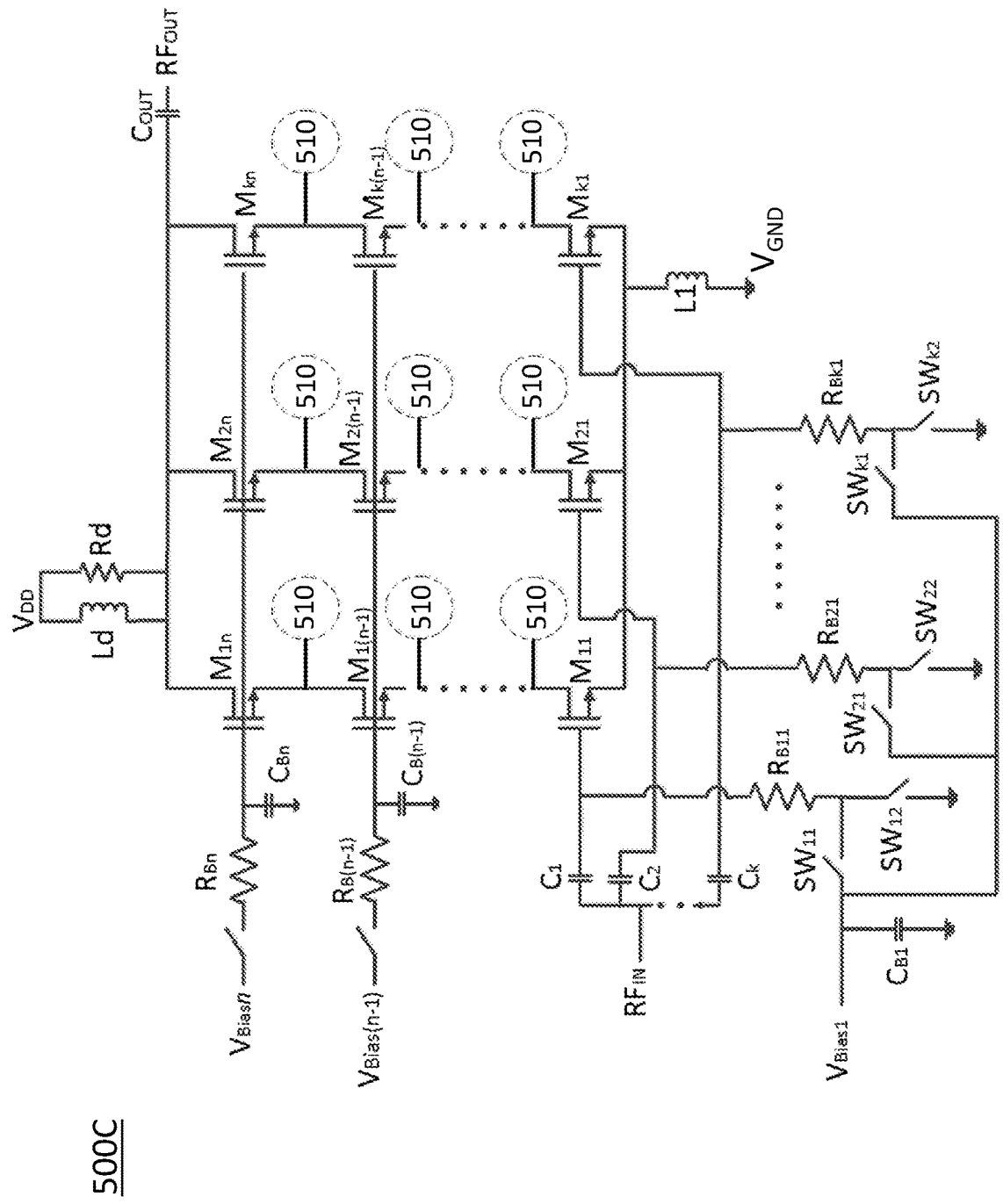
FIG. 5C shows a configuration of a multi-branch cascode amplifier according to an embodiment of the present disclosure comprising a plurality of branches, each branch comprising a plurality of common-gate cascode transistors, including protection circuits coupled to the common-gate cascode transistors of each branch.

According to an exemplary embodiment of the present disclosure, the reference voltage to each of the protection circuits (510) of a branch of the configuration shown in FIG. 5A, can be provided by a resistive ladder network (Rk1, . . . , Rk(n−1)) shown in FIG. 5B that is coupled between a reference voltage, $V_{DD2}$, and the reference ground, $V_{GND}$, wherein nodes of the resistive ladder network resistively divide the reference voltage, $V_{DD2}$, to generate the reference voltages ($V_{DD21}$, . . . , $V_{DD2(n-1)}$) provided to a respective protection circuit (510). As shown in FIG. 5B, the exemplary resistive ladder network may include a plurality of series connected resistors (Rk1, . . . , Rk(n−1)) forming common nodes that may carry the reference voltages ($V_{DD21}$, . . . , $V_{DD2(n-2)}$), and the reference voltage $V_{DD2(n-1)}$ provided to the protection circuit (510) coupled to the output common-gate cascode transistor Mkn may be the reference voltage $V_{DD2}$.

FIG. 5C is a configuration of a multi-branch cascode amplifier (500C) according to an embodiment of the present disclosure comprising a plurality k of branches, (M11, . . . , M1n), . . . , and (Mk1, . . . , Mkn), each branch comprising a plurality of common-gate cascode transistors, (M12, . . . , M1n), . . . , and (Mk2, . . . , Mkn) and respective common-source (input) transistors M11, . . . , and Mk1. Furthermore, each branch may include respective one or more protection circuits (510) coupled to one or more of the common-gate cascode transistors of the branch. A person skilled in the art would understand that the configuration shown in FIG. 5C represents a generalization of the above teachings to a multi-branch amplifier having a generic number of branches, each branch having a generic number of cascode transistors. Accordingly, the person skilled in the art would clearly know how to apply the above teachings to the multi-branch cascode configuration (500C) of FIG. 5C.

It should be noted that teachings according to the present disclosure may apply to multi-branch cascode amplifiers (e.g., per FIG. 5C) that are used as low-noise amplifiers (LNAs) in, for example, receiver sections of RF front-end modules. Furthermore, the present teachings may also be adapted for use as power amplifiers (PAs) in, for example, transmitter sections of RF front-end modules. In some cases, adapting of the multi-branch cascode amplifiers (e.g., per FIG. 5C) for use as PAs may include choosing different values of the gate capacitors (e.g., $C_{Bn}$, $C_{B(n-1)}$, . . . of FIG. 5C) coupled to the gates of the cascode transistors (e.g., M1n, M1(n−1), . . . of FIG. 5C). According to some embodiments of the present disclosure, such choosing may be to provide a coupling of an RF signal at a source node of a cascode transistor of a branch (e.g., M1n, M1(n−1), . . . , M11) to a corresponding gate node of the cascode transistor to control a division (distribution) of an RF voltage at an output node (e.g., drain of M1n of FIG. 5C) of the branch across the transistors of the branch.

Figure 6:
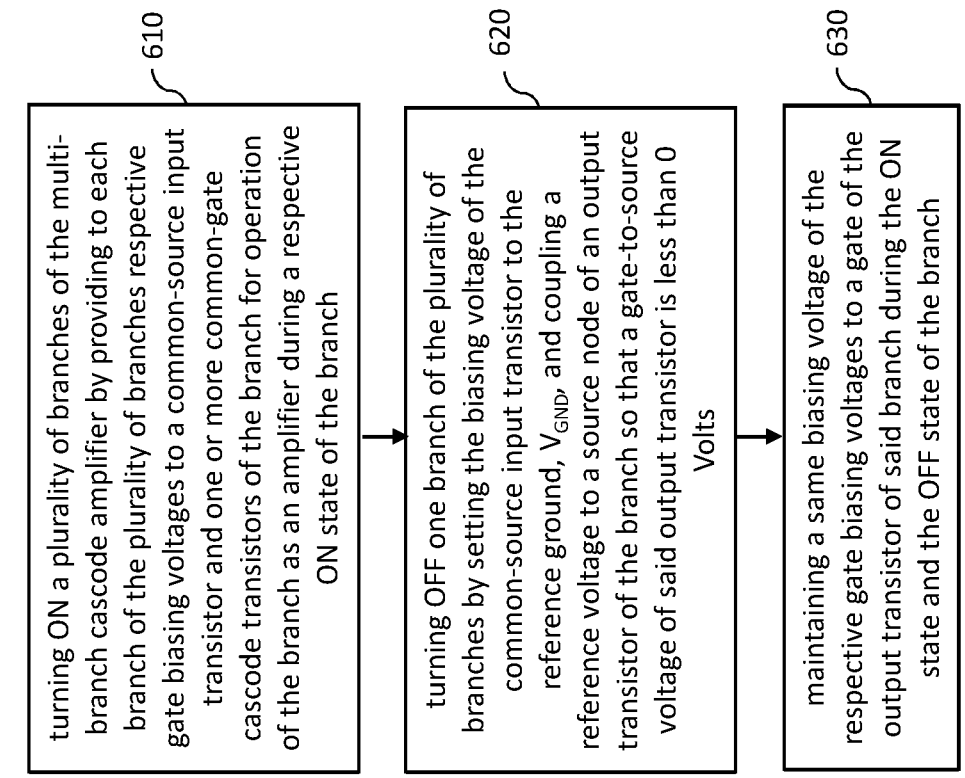
FIG. 6 is a process chart showing various steps of a method for turning OFF a branch of a multi-branch cascode amplifier.

FIG. 6 is a process chart (600) showing various steps of a method for turning OFF a branch of a multi-branch cascode amplifier. As can be seen in the process chart (600), such method comprises: turning ON a plurality of branches of the multi-branch cascode amplifier by providing to each branch of the plurality of branches respective gate biasing voltages to a common-source input transistor and one or more common-gate cascode transistors of the branch for operation of the branch as an amplifier during a respective ON state of the branch, per step (610); turning OFF one branch of the plurality of branches by setting the biasing voltage of the common-source input transistor to the reference ground, $V_{GND}$, and coupling a reference voltage to a source node of an output transistor of the branch so that a gate-to-source voltage of said output transistor is less than 0 Volts, per step (620); and maintaining a same biasing voltage of the respective gate biasing voltages to a gate of the output transistor of said branch during the ON state and the OFF state of the branch, per step (630).

It should be noted that the various embodiments of the multi-branch amplifier circuits according to the present disclosure may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single- or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET" technically refers to metal-oxide-semiconductor FET; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductor FET, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functions without significantly altering the functionality of the disclosed circuits.

The examples set forth above are provided to give those of ordinary skill in the art a complete disclosure and description of how to make and use the embodiments of the present disclosure, and are not intended to limit the scope of what the applicant considers to be the invention. Such embodiments may be, for example, used within mobile handsets for current communication systems (e.g. WCDMA, LTE, WiFi, etc.) wherein amplification of signals with frequency content of above 100 MHz and at power levels of above 50 mW may be required. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A multi-branch cascode amplifier comprising:
   a plurality of stacked cascode amplifier branches, each branch comprising a common-source input transistor and one or more common-gate cascode transistors comprising an output transistor whose drain, that is coupled to a supply voltage, is a common output node of the multi-branch cascode amplifier, the each branch configured to operate according to an ON state for amplification at the common output node of an input RF signal coupled to the input transistor of the branch, and an OFF state for no amplification of the input RF signal; and
   a protection circuit coupled to a source node of the output transistor of a first branch of the plurality of stacked cascode amplifier branches,
   wherein:
      during the OFF state of the first branch and the ON state of one or more other branches of the plurality of stacked cascode amplifier branches, the protection circuit is configured to selectively couple a reference voltage to the source node of the output transistor of the first branch.

2. The multi-branch cascode amplifier of claim 1, wherein when the reference voltage is coupled to the source node of the output transistor of the first branch, a gate-to-source voltage of said output transistor is less than 0 Volts.

3. The multi-branch cascode amplifier of claim 1, wherein a biasing voltage to a gate of the output transistor of the first branch during the ON state and the OFF state of the first branch is a same biasing voltage.

4. The multi-branch cascode amplifier of claim 1, wherein:
   the protection circuit comprises a first switch comprising a first terminal coupled to the source node of the output transistor of the first branch, and a second terminal coupled to the reference voltage,
   during the ON state of the first branch, the first switch is open and thereby decouples the reference voltage from the source node of said output transistor via an off capacitance of the first switch, and
   during the OFF state of the first branch and the ON state of the one or more other branches, the first switch is closed and thereby couples the reference voltage to the source node of said output transistor via an on resistance of the first switch.

5. The multi-branch cascode amplifier of claim 4, wherein the on resistance of the first switch is configured to affect an impedance seen at the source node of said output transistor at a frequency of operation of the input RF signal so that an amplitude of an amplified version of the input RF signal by the one or more other branches that is coupled to said source node via an off capacitance of said output transistor is sufficiently reduced to operate a transistor of the first branch that is directly coupled to said output transistor within a tolerable voltage range of said transistor.

6. The multi-branch cascode amplifier of claim 5, wherein, at the frequency of operation of the input RF signal, the on resistance of the first switch is equal to, or smaller than, one tenth of a magnitude of an impedance seen at the source node of said output transistor looking down the first branch when the first branch is OFF.

7. The multi-branch cascode amplifier of claim 4, wherein each of the common-source input transistors and the one or more common-gate cascode transistors of the first branch is a thin-oxide transistor having a maximum tolerable voltage that is smaller than a peak voltage provided by a combination of: a) the supply voltage, and b) an amplified version of the input RF signal by the one or more other branches at the common output node of the multi-branch cascode amplifier.

8. The multi-branch cascode amplifier of claim 7, wherein:
the first switch is one of: a) an electromechanical switch, b) a MEMS switch, and c) a transistor switch.

9. The multi-branch cascode amplifier of claim 8, wherein the transistor switch c) is an NMOS FET transistor, wherein:
a source node of c) defines the first terminal of the first switch,
a drain node of c) defines the second terminal of the first switch, and
a gate node of c) is coupled to a control signal configured to control the first switch to close or open.

10. The multi-branch cascode amplifier of claim 4, wherein the protection circuit further comprises:
a capacitor coupled to said source node via a first terminal of the capacitor;
a second switch coupled to a second terminal of the capacitor at a first terminal of the second switch, a second terminal of the second switch coupled to the reference ground,
wherein:
during the ON state of the first branch, the second switch is open and thereby decouples the reference ground from the second terminal of the capacitor via an off capacitance of the second switch, and
during the OFF state of the first branch and the ON state of the one or more other branches, the second switch is closed and thereby couples the reference ground to the second terminal of the capacitor via an on resistance of the second switch.

11. The multi-branch cascode amplifier of claim 10, wherein:
the on resistance of the first switch is substantially larger than the on resistance of the second switch, and
a combined impedance of the protection circuit is configured to affect an impedance seen at the source node of said output transistor at a frequency of operation of the input RF signal so that an amplitude of an amplified version of the input RF signal by the one or more other branches that is coupled to said source node via an off capacitance of said output transistor is sufficiently reduced to operate a transistor of the first branch that is directly coupled to said output transistor within a tolerable voltage range of said transistor.

12. The multi-branch cascode amplifier of claim 11, wherein, at the frequency of operation of the input RF signal, a magnitude of an impedance provided by a series connection of the on resistance of second switch with the capacitor is equal to, or smaller than, one tenth of a magnitude of an impedance seen at the source node of said output transistor looking down the first branch when the first branch is OFF.

13. The multi-branch cascode amplifier of claim 10, wherein each of the common-source input transistors and the one or more common-gate cascode transistors of the first branch is a thin-oxide transistor having a maximum tolerable voltage that is smaller than a peak voltage provided by a combination of: a) the supply voltage, and b) an amplified version of the input RF signal by the one or more other branches at the common output node of the multi-branch cascode amplifier.

14. The multi-branch cascode amplifier of claim 13, wherein:
the supply voltage is about 1.2 Volts,
each branch consists of the common-source input transistor and the common-gate cascode output transistor, and
the common-source input transistor and the common-gate cascode output transistor of each branch is a thin-oxide transistor with a maximum tolerable voltage of about 1.32 Volts.

15. The multi-branch cascode amplifier of claim 10, wherein the first switch is a PMOS FET transistor and the second switch is an NMOS FET transistor, wherein:
a drain node of the PMOS FET transistor defines the first terminal of the first switch,
a source node of the PMOS FET transistor defines the second terminal of the first switch,
a gate node of the PMOS FET transistor is coupled to a first control signal configured to control the first switch to close or open,
a drain node of the NMOS FET transistor defines the first terminal of the second switch,
a source node of the NMOS FET transistor defines the second terminal of the second switch, and
a gate node of the NMOS FET transistor is coupled to a second control signal configured to control the second switch to close or open.

16. The multi-branch cascode amplifier of claim 15, wherein:
a voltage level of the first control signal and of the second control signal is within a range defined by the reference ground and the supply voltage.

17. The multi-branch cascode amplifier of claim 15, further comprising a second protection circuit coupled to a source node of a common-gate cascode transistor of the one or more common-gate cascode transistors of the first branch that is different from the output transistor of the first branch; wherein:
during the OFF state of the first branch and the ON state of one or more other branches of the plurality of stacked cascode amplifier branches, the second protection circuit is configured to selectively couple a second reference voltage to the source node of said common-gate cascode transistor of the first branch so that a gate-to-source voltage of said common-gate cascode transistor is less than 0 Volts, and
a biasing voltage to a gate of said common-gate cascode transistor of the first branch during the ON state and the OFF state of the first branch is a same biasing voltage.

18. The multi-branch cascode amplifier of claim 1, wherein for each of the plurality of stacked cascode amplifier branches, the common-source input transistor and the one or more common-gate cascode transistors comprise thin metal-oxide-semiconductor (MOS) field effect transistors (FETs).

19. The multi-branch cascode amplifier of claim 18, wherein said transistors are fabricated using one of: a) silicon-on-insulator (SOI) technology, b) silicon-on-sapphire (SOS) technology, and c) bulk silicon (Si) technology.

20. The multi-branch cascode amplifier of claim 1, wherein the multi-branch cascode amplifier is monolithically integrated.

21. An electronic module comprising the multi-branch cascode amplifier of claim 1.

22. A radio frequency (RF) front-end module, comprising:
a receiver section for amplifying an RF signal according to different modes of operation, the receiver section comprising the multi-branch cascode amplifier of claim 1 operating as a low-noise amplifier (LNA).

23. A method for turning OFF a branch of a multi-branch cascode amplifier, the method comprising:
turning ON a plurality of branches of the multi-branch cascode amplifier by:
providing to each branch of the plurality of branches respective gate biasing voltages to a common-source input transistor and one or more common-gate cascode transistors of the branch for operation of the branch as an amplifier during a respective ON state of the branch; and
turning OFF one branch of the plurality of branches by:
setting the biasing voltage of the common-source input transistor to the reference ground, $V_{GND}$, and
coupling a reference voltage to a source node of an output transistor of the branch so that a gate-to-source voltage of said output transistor is less than 0 Volts, and
maintaining a same biasing voltage of the respective gate biasing voltages to a gate of the output transistor of said branch during the ON state and the OFF state of the branch.

24. The method according to claim 23, wherein the coupling of the reference voltage to the source node of the output transistor affects an impedance seen at the source node of said output transistor at a frequency of operation of the amplifier so that an amplitude of an amplified RF signal by one or more other turned ON branches that is coupled to said source node via an off capacitance of said output transistor is sufficiently reduced to operate a transistor of the first branch that is directly coupled to said output transistor within a tolerable voltage range of said transistor.

* * * * *